(12) United States Patent
Hesselink et al.

(10) Patent No.: US 7,129,006 B2
(45) Date of Patent: Oct. 31, 2006

(54) OPTICAL DATA STORAGE SYSTEM AND METHOD

(75) Inventors: Lambertus Hesselink, Atherton, CA (US); Brian H. Cumpston, Sunnyvale, CA (US); Matthew Lipson, Sunnyvale, CA (US)

(73) Assignee: Research Investment Network, Inc., Long Beach, CA (US)

( * ) Notice: Subject to any disclaimer, the term of this patent is extended or adjusted under 35 U.S.C. 154(b) by 191 days.

(21) Appl. No.: 10/194,448

(22) Filed: Jul. 11, 2002

(65) Prior Publication Data

US 2004/0009406 A1   Jan. 15, 2004

Related U.S. Application Data

(63) Continuation of application No. 09/626,504, filed on Jul. 27, 2000, now abandoned.

(60) Provisional application No. 60/146,519, filed on Jul. 30, 1999, now abandoned.

(51) Int. Cl.
*G03H 1/04* (2006.01)
(52) U.S. Cl. .................... 430/1; 430/2; 359/3
(58) Field of Classification Search .............. 430/1, 430/2; 359/3
See application file for complete search history.

(56) References Cited

U.S. PATENT DOCUMENTS

| | | | | |
|---|---|---|---|---|
| 4,624,910 A | * | 11/1986 | Takeda | 430/203 |
| 4,908,285 A | * | 3/1990 | Kushibiki et al. | 430/1 |
| 5,182,180 A | * | 1/1993 | Gambogi et al. | 430/1 |
| 5,242,715 A | | 9/1993 | Schoen et al. | 427/386 |
| 5,374,493 A | * | 12/1994 | Fukunaga et al. | 430/7 |
| 5,523,584 A | * | 6/1996 | Celis et al. | 250/584 |
| 5,625,617 A | | 4/1997 | Hopkins et al. | 369/121 |
| 5,639,579 A | * | 6/1997 | Hayashi et al. | 430/7 |
| 5,698,343 A | * | 12/1997 | Sutherland et al. | 430/1 |
| 5,917,848 A | | 6/1999 | Claisse et al. | 372/96 |
| 6,009,064 A | | 12/1999 | Hajjar | 369/112 |
| 6,122,079 A | * | 9/2000 | Branca et al. | 359/15 |
| 6,212,148 B1 | * | 4/2001 | Hesselink et al. | 369/103 |
| 6,310,850 B1 | * | 10/2001 | Sochava et al. | 369/103 |
| 6,322,931 B1 | * | 11/2001 | Cumpston et al. | 430/1 |

(Continued)

FOREIGN PATENT DOCUMENTS

EP          457153          *    5/1991

(Continued)

*Primary Examiner*—Martin Angebranndt
(74) *Attorney, Agent, or Firm*—Steve A. Wong; Caroline T. Do

(57) ABSTRACT

An optical storage system and method having separate, independent format hologram writing and data writing mechanisms to allow optimization of data writing separately from format hologram recording. In its most general terms, the invention comprises an optical medium having a first, photoactive material responsive to a first, format hologram recording condition and a second photo-active material, responsive to a second, data writing condition, which is dispersed or dissolved in the first photoactive material. The second photoactive material may additionally be "erasable" under a third, erasing condition. The second photoactive material is preferably in the form of microparticles, microdroplets or microcapsules which are dispersed throughout the first photoactive material. The format hologram is recorded in the first photoactive material when the optical medium is subject to the first, format hologram recording condition, and the data writing is subsequently carried out separately, in connection with the second photoactive material, under the second, data writing condition. The separate format hologram recording and bit writing functions provided by the diferent conditions make them orthogonal.

10 Claims, 17 Drawing Sheets

U.S. PATENT DOCUMENTS 6,322,933 B1 * 11/2001 Daiber et al. .................. 430/2
6,512,606 B1 * 1/2003 Lipson et al. .................. 359/3
6,657,927 B1  12/2003 Awano et al. ............ 369/13.23

FOREIGN PATENT DOCUMENTS

| JP | 60-098521 | * | 6/1985 |
| JP | 61-192022 | * | 8/1986 |
| JP | 01-116636 | * | 5/1989 |
| JP | 01-293306 | * | 11/1989 |
| JP | 05-034514 | * | 2/1993 |
| JP | 10-120766 | * | 5/1998 |
| JP | 10-239515 | * | 9/1998 |
| JP | 11-060989 | * | 5/1999 |
| WO | WO 98/04650 | * | 2/1998 |

* cited by examiner

OPTICAL DATA STORAGE SYSTEM AND METHOD

RELATED APPLICATION DATA

This application is a continuouation of application Ser. No. 09/626,504, filed Jul. 27, 2000 now abandoned.

This application is entitled to the benefit of U.S. Provisional Patent Application Ser. No. 60/146,519 filed Jul. 30, 1999 now abandoned. This Application is related to U.S. patent application Ser. No. 09/016,382, now U.S. Pat. No. 6,212,148, U.S. patent application Ser. No. 09/229,457, now U.S. Pat. No. 6,322,933, U.S. patent application Ser. No. 09/364,552, now abandoned, U.S. patent application Ser. No. 09/364,324, now U.S. Pat. No. 6,512,606 and U.S. patent application Ser. No. 09/364,323 now U.S. Pat. No. 6,310,850.

BACKGROUND OF THE INVENTION

1. Field of the Invention

The present invention pertains generally to optical information storage systems, devices, media and methods. More particularly, the invention pertains to an optical information storage system and method wherein data is written as micro-localized alterations in a format hologram at selectable data storage locations. Bit writing is optimized separately from format hologram recording via use of microdroplets, microparticles or microcapsules, dispersed in a photopolymer medium, which generate an optically detectable change or alteration in the format hologram upon irradiation by a data writing beam. The conditions used for data writing are generally different from those used for recording the format hologram, such that format hologram recording and data writing are orthogonal.

2. Background

Optical data storage technology has tended to follow two complementary lines of development. In one approach, data is encoded as minute variations in the surface of a recording medium, such as a compact disc, or CD. The data are readable using optical means (usually a laser), similar to the way in which data recorded in a magnetic medium are readable with a magnetically-sensitive head, or data recorded in a vinyl medium are readable with a needle. Unlike vinyl recording, however, in optical storage the data are usually stored digitally. For read-only compact discs, data are stored as microscopic pits on the surface of a substrate. In addition, recordable or re-writable bit-based optical systems are readily available Examples include magneto-optic systems, in which the orientation of a magnetic domain changes the direction of rotation of the polarization of a reflected, focussed light beam; phase-change systems, in which a medium can be locally crystalline or polycrystalline, each of which states have a variance in reflectivity; and, dye-polymer systems, in which the reflectivity of a medium is changed by the high-power illumination.

Each bit of data has a specific physical location in the storage medium. The storage density of optical media is limited by physical constraints on the minimum size of a recording spot. Another basic limitation of conventional optical storage is that data are usually stored on the surface of the medium only. Recording throughout the volume of a storage medium would provide an opportunity to increase capacity.

Multi-layer storage is also possible, but usually requires the manufacture of special, heterogeneous, layered recording media, whose complexity increases quickly with the number of layers needed. Most commercially-available multi-layer optical storage media offer no more than two data layers, and come in a pre-recorded format.

An alternative approach to traditional optical storage is based on holographic techniques. In conventional volume holographic recording, laser light from two beams, a reference beam and a signal beam containing encoded data, meet within the volume of a photosensitive holographic medium. The interference pattern from the superposition of the two beams results in a change or modulation of the refractive index of the holographic medium. This modulation within the medium serves to record both the intensity and phase information from the signal. The recorded intensity and phase data are then retrieved by exposing the storage medium exclusively to the reference beam. The reference beam interacts with the stored holographic data and generates a reconstructed signal beam which is proportional to the initial signal beam used to store the holographic image. For information on conventional volume holographic storage, see, for example, U.S. Pat. Nos. 4,920,220, 5,450,218, and 5,440,669.

Typically, volume holographic storage is accomplished by having data written on the holographic medium in parallel, on 2-dimensional arrays or "pages" containing $1 \times 10^6$ or more bits. Each bit is generally stored as information extending over a large volume of the holographic storage medium, therefore, it is of no consequence to speak in terms of the spatial "location" of a single bit. Multiple pages can then be stored within the volume by angular, wavelength, phase-code or related multiplexing techniques.

Unfortunately, conventional volume holographic storage techniques generally require complex, specialized components such as amplitude and/or phase spatial light modulators. Ensuring that the reference and signal beams are mutually coherent over the entire volume of the recording medium generally requires a light source with a relatively high coherence length, as well as a relatively stable mechanical system. These requirements have, in part, hindered the development of inexpensive, stable, and robust holographic recording devices and media capable of convenient operation in a typical user environment.

In order for volumetric optical data storage to mature into a viable data storage option the process must be developed so that the operation is relatively simple, inexpensive and robust. Foremost in this development is accomplishing multi-depth bit-wise optical data storage and/or retrieval. As data recording proceeds to a greater number of depths within the storage medium it becomes increasingly more critical to isolate the recorded bit within a specific area within the medium. In multi-depth storage and/or retrieval, it is also important to write data at a given depth without affecting data at other depths. Further, for multi-depth bit-wise optical data storage and/or retrieval, it is important to have separate write and read conditions, so that readout does not negatively affect recorded data.

BRIEF DESCRIPTION OF THE INVENTION

An effective system for optical data storage involves the recording of a format hologram in an optical medium, and then recording data in the medium by creating localized alterations in the format hologram at selected data storage locations. One approach to this type of optical data storage is described in co-pending U.S. patent application Ser. No. 09/016,382, filed on Jan. 30, 1998, to inventor Hesselink et al., and entitled "Optical Data Storage By Selective Localized Alteration of a Format Hologram and/or Retrieval by Selective Alteration of a Holographic Storage Medium." The alterations are created by focusing a data writing beam at selected data storage locations within the optical medium to cause localized photo-induced heating or chemical reaction such that the format hologram is altered at the data storage location. The alteration is generally caused by expansion or contraction, a change in refractive index, including grating fringe contrast, due to locally advanced polymerization, or another optically detectable change at the data storage location.

The present invention advantageously provides an optical storage system and method having separate, independent format hologram writing and data writing mechanisms to allow optimization of data writing separately from format hologram recording. In its most general terms, the invention comprises an optical medium having a first, photoactive material responsive to a first, format hologram recording condition to cause a first optically detectable change in the medium, and a second photo-active material, responsive to a second, data writing condition to undergo a second optically detectable change, which is dispersed or dissolved in the first photoactive material. The second, data-writing condition may be reversible such that the photoactive material is "erasable" under a third, erasing condition. The second photoactive material is preferably in the form of microparticles, microdroplets or microcapsules which are dispersed or dissolved throughout the first photoactive material. The format hologram is recorded in the first photoactive material when the optical medium is subject to the first, format hologram recording condition, and the data writing is subsequently carried out separately. In connection with the second photoactive material, under the second, data writing condition. The separate formal hologram recording and bit writing functions provided by the invention allow independent optimization of format hologram recording and bit writing.

By way of example, and not necessarily by way of limitation, the first photoactive material is preferably a photoactive monomer or monomer/polymer mix which is generally photosensitive to polymerization under the first, format hologram recording condition, together with an active binder material having a different refractive index than the monomer/polymer. The monomer/polymer is more preferably a cationic ring opening type polymerization material.

The second photoactive material may comprise one or more of a variety of materials, preferably in microparticle, microdroplet, microinclusion or microcapsule form (hereinafter collectively referred to as "microparticles"), which undergo a photo-induced phase or color change, or which cause change in adjacent photoactive material such as local advancement of polymerization, or which otherwise undergo an optically detectable change in the medium when subject to the second, data writing condition. The photo-induced change in the second photoactive material may be permanent for WORM applications, or reversible, under a third condition, to allow subsequent erasure and re-writing of recorded data. The microparticles of the second photoactive material are of sufficiently small size that optical losses due to scattering are minimized and achievement of high microparticle density per bit volume is achieved.

The format hologram recording condition and data writing condition may be wavelength specific, such that format hologram recording is carried out via signal and reference beams at a first wavelength, while data recording is carried out with a write beam at a second, different wavelength. The first and second conditions may additionally, or alternatively, comprise differing light intensities, different temperatures, the presence or absence of an external magnetic field(s), the presence or absence of an external electric field(s), or other conditions which allow data writing to be carried out separately and independently from the prior format hologram recording. In the case where the second photoactive material is erasable, the third, erasing condition may likewise comprise differing light wavelength or light intensity, temperature, the presence or absence of an external magnetic or electric field(s), or other conditions which can reverse the photo-induced change made to the second photoactive material during data writing.

In one preferred embodiment of the invention, the second photoactive material comprises light absorbing microparticles dispersed throughout the photopolymer material. Light absorbed by the microparticles is converted to heat which initiates the chemistry or physical change required to write data as localized alterations to the format hologram by locally advancing polymerization of the photopolymer material adjacent to the microparticles. The light absorbing microparticles may comprise carbon black, solid or liquid dye, or other strongly absorbing solid or liquid material.

In another preferred embodiment of the invention, the second photoactive material comprises microparticles of an electrooptic material, dispersed in the photopolymer material, which undergo an optically detectable phase change, color change, or change in fluorescent or phosphoresent properties, which may be reversible to allow repeated R/W applications. The electro-optic material may alternatively undergo a phase change that allows or promotes local advancement of polymerization of the photopolymer medium adjacent to the microparticles.

In yet another embodiment of the invention, the second photoactive material comprises microparticles of magneto-optic material which are initially magnetically aligned via magnetic field and then retained in alignment by partial polymerization of the photopolymer. Under the data recording condition, the microparticles at a data storage location are heated above their Curie point at the waist of a write beam, and then allowed to cool while exposed to a different magnetic field orientation to create recorded data. The recorded data is read via polarization change via the Faraday effect of the magnetic particles at the data storage location, which have a different alignment, and thus a different polarization effect, than is provided by magnetic particles outside the data storage location.

The method of the invention comprises generally the steps of providing an optical data storage medium having a first photoactive material with microparticles of a second photoactive material evenly dispersed therein, recording a format hologram in the optical data storage medium under a first, hologram recording condition, and writing data, as localized alterations in the format hologram via a mechanism associated with the microparticles of the second photactive material, under a second, data writing condition. The method may additionally include the steps of erasing data written in the data writing step under a third, erasing condition, and then writing new data under the data writing condition. The step of providing the photoactive materials will also generally include the steps of evenly dispersing the microparticles of the second photoactive material throughout the first photoactive material The invention provides an optical data storage system and method which allows the recording of a format hologram in an optical medium, and then recording data in the medium by creating localized alterations in the format hologram at selected data storage locations. The invention also provides an optical data storage system and method which allows separate, independent optimization of format hologram recording and data writing. The invention further provides an optical data storage system and method which utilizes microparticles of a photoactive material, embedded in a photopolymer matrix, to carry out data writing. The invention still further provides an optical data storage system and method wherein a format hologram is recorded under a first condition, and data or bit storage is subsequently carried out under a second, different condition in connection. The invention additionally provides an optical data storage system and method wherein previously recorded data can be erased or deleted under an erasure condition to allow subsequent writing of new data.

Further advantages of the invention will be brought out in the following portions of the specification, wherein the detailed description is for the purpose of fully disclosing the preferred embodiments of the invention without placing limitations thereon.

BRIEF DESCRIPTION OF THE DRAWINGS

The present invention will be more fully understood by reference to the following drawings, which are provided for illustrative purposes only.

DETAILED DESCRIPTION OF A PREFERRED EMBODIMENT

Referring more specifically to the drawings, for illustrative purposes the present invention is shown as embodied in the optical data storage system and method depicted in FIG. 1 through FIG. 9. It will be appreciated that the optical media may vary with respect to details regarding ingredients and amounts thereof, that the optical data storage and retrieval system may vary as to configuration and as to details of the parts, and that the method may vary as to details and the order of steps, without departing from the basic concepts as disclosed herein. The invention is disclosed generally in terms of use of photopolymer media, although various other bulk optical media, including photochromic and thermochromic media, doped and undoped ferroelectric crystal media, and other optically responsive media, may be used with the invention and will suggest themselves to persons of ordinary skill in the art. The term "microparticles" as used herein is intended to encompass "microdroplets" and "microcapsules" as well. The terms "dispersed" and "dissolved" are used interchangeably herein and may be considered the same for the purposes of this disclosure. The term "photopolymer" as used herein means generally any monomer, polymer or monomer/polymer mix which can undergo light-induced polymerization.

Figure 1A:
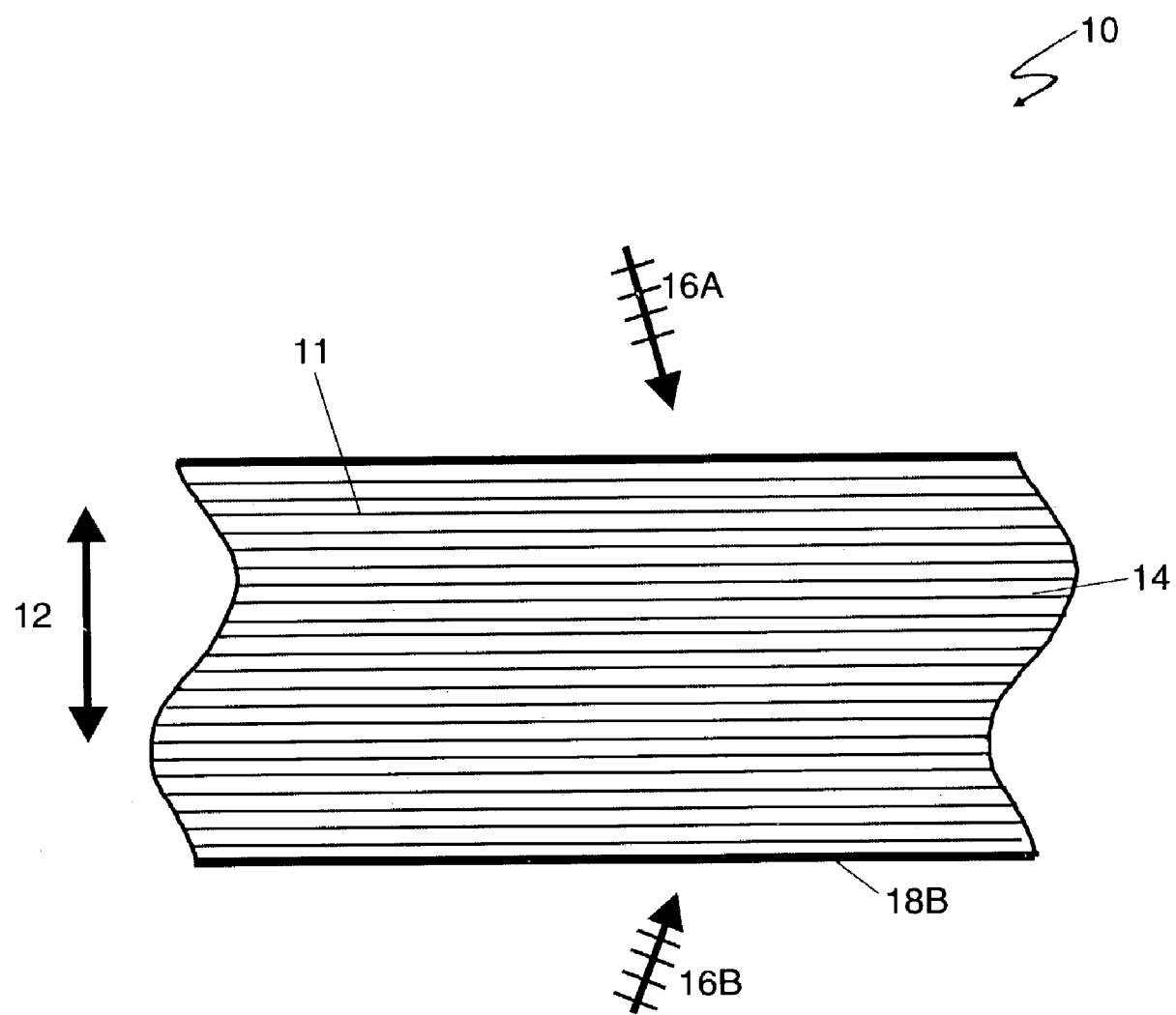
FIG. 1A is a schematic diagram of an elevational cross section of a bulk optical medium and two plane-wave beams used to form interference fringes within the medium.

Referring first to FIG. 1A, there is shown a cross-sectional elevational schematic drawing of a bulk optical recording medium 10 used in a presently preferred embodiment of the invention. The bulk recording medium 10 shown in FIG. 1A includes a format hologram 11 having a periodic, spatially-modulated refractive index that varies along a single depth axis 12 of medium 10, defining a plurality of reflective Bragg fringes 14. Preferably, the bulk medium 10 is typically on the order of magnitude of 100 microns in thickness, for instance, about 100–200 μm, and the spacing between Bragg fringes 14 is approximately one thousand times smaller, on the typical order of magnitude of 100 nanometers, for instance, about 170 nanometers. The spacings shown in FIG. 1A, therefore, are not drawn to scale.

The periodic structure of format grating 11 in bulk recording medium 10 defines a first Bragg reflection condition such that the medium 10 is particularly reflective to light of certain frequencies incident upon the medium 10 at specific angles respectively, and is relatively transparent to light from other sources. Specifically, if the spacing between Bragg fringes is d, the index of refraction is n and the light is incident upon the medium 10 at an angle of $\theta$ with wavelength $\lambda$, then the Bragg reflection condition is that the quantity $2nd \sin \theta$ should be equal to $\lambda$: $\lambda = 2nd \sin \theta$, in which $\theta$ is the angle between the direction of propagation of a plane wave and a Bragg fringe within the medium. The Bragg reflection condition defines peak reflection. Generally, it is well known that substantial reflection will occur for a small range of wavelengths at a fixed angle, or a small range of angles at a fixed wavelength. In particular, the Bragg reflection condition depends on the spacing between consecutive fringes 14. For a reflection grating Bragg-matched for normal incidence, $\theta = \pi/2$, therefore $\lambda = 2nd$. "Optical fringe spacing" is defined as nd.

The photosensitive layer or medium 10 can be formed, for example, by depositing a photoactive material or materials between two spaced-apart glass plates. The photoactive materials preferably comprise a first, photoactive material responsive to a first, format hologram recording condition, and microparticles of a second photo-active material, responsive to a second, data writing condition, which are dispersed in the first photoactive material. The first photoactive material preferably comprises a photoactive monomer or monomer/polymer mix which is generally photosensitive to polymerization under the first, format hologram recording condition, together with an active binder material having a different refractive index than the monomer/polymer, as described further below. The second photoactive material may comprise one or more of a variety of materials, in microparticle form, which undergo a photo-induced phase or color change, or which locally advance adjacent polymerization, or which otherwise undergo an optically detectable change when subject to the second, data writing condition. The term "microparticles" as used herein is intended to encompass liquid and/or solid microparticles, microdroplets, microcapsules of the second photoactive material which are of sufficiently small size that optical losses due to scattering are minimized in medium 10. The preferred second photoactive materials are also described further below.

A presently preferred method for recording a format hologram 11 is illustrated in FIG. 1A The bulk recording medium 10 is exposed to a first, hologram recording condition, which generally comprises two coherent monochromatic light beams 16a and 16b. Beams 16a and 16b can be generated from a single beam of laser light using a beam splitter and optical elements well-known to those of ordinary skill in the art of holography. The beams 16a and 16b are incident upon opposite sides 18a and 18b of medium 10 at slightly oblique angles. An interference pattern of light and dark fringes 14 of a format hologram 11 is established that alters the refractive index in the of the first photoactive material in those parts of medium 10 where beams 16a and 16b constructively interfere. Hologram 11 is stored in medium 10 via photopolymerization of the first photoactive material occurs at the light fringes 14 due to phase-separation induced refractive index change, as described further below. The spacing between these fringes 14 will be on the order of half the wavelength of beams 16a and 16b. Preferably, the exposed hologram 11 is then fixed to render the photopolymer insensitive to further holographic exposure at the wavelength used to record the format hologram. Data (not shown) are then subsequently recorded bit-wise as local alterations of the format hologram at discrete physical locations, using a second, data writing condition, which will preferably comprise a data writing beam with a wavelength different from that used for the recording of format hologram 11.

Figure 1B:
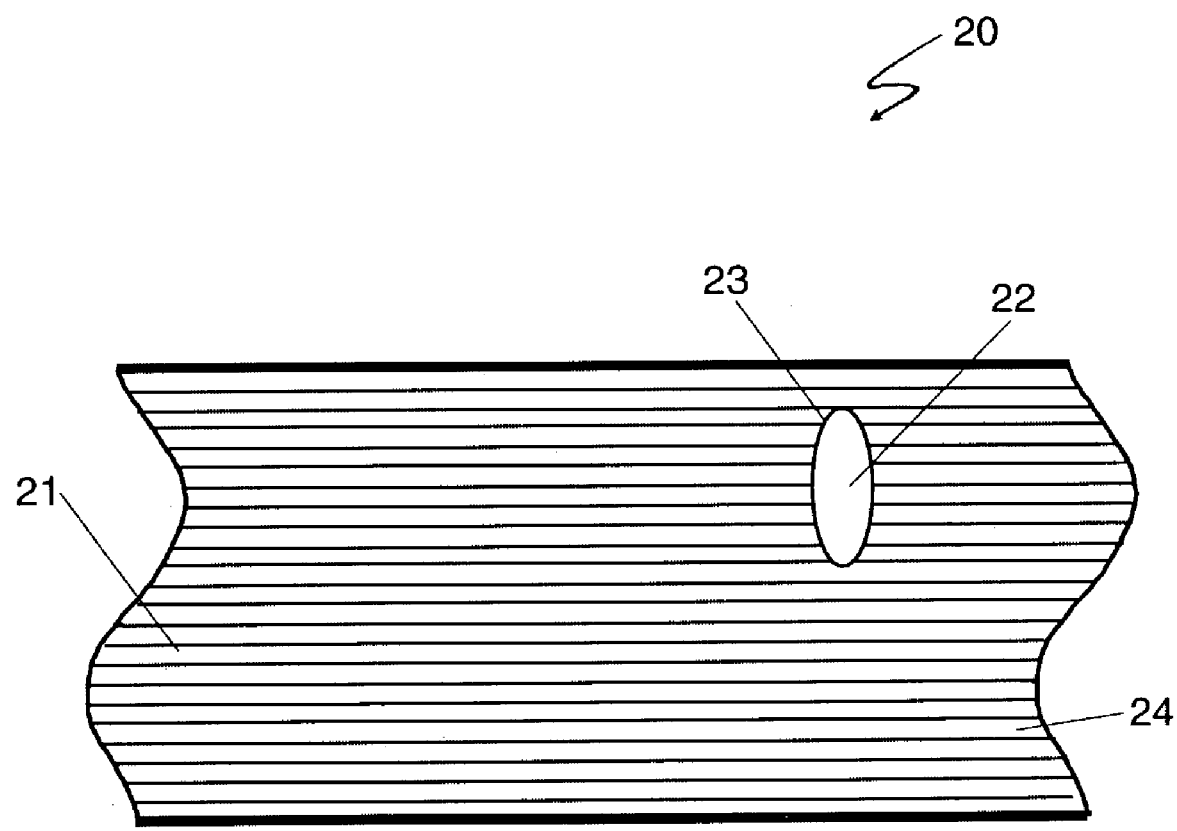
FIG. 1B is a schematic diagram of an elevational cross section of a bulk optical storage medium having a planar format hologram stored therein and a data bit recorded within the hologram.

FIG. 1B illustrates a schematic diagram of a bulk optical storage medium 20 having a recorded data bit 22 stored therein. The recorded data bit 22 is formed by disrupting, deleting, erasing, enhancing, varying, or otherwise altering a format hologram 21 in the bulk optical storage medium 20 at a selected data storage location 23. Medium 22 will generally include a plurality of additional data bits (not shown) like data bit 22, which are recorded at selected data storage or bit locations (not shown) throughout medium 20. One method of data encoding according to the present invention is to represent one binary data state by leaving the format hologram 21 unaltered at a bit or storage location, and to represent the other data state by altering the grating fringes 24 of the format hologram 21 at a bit location as is illustrated schematically by region 22.

Figure 1C:
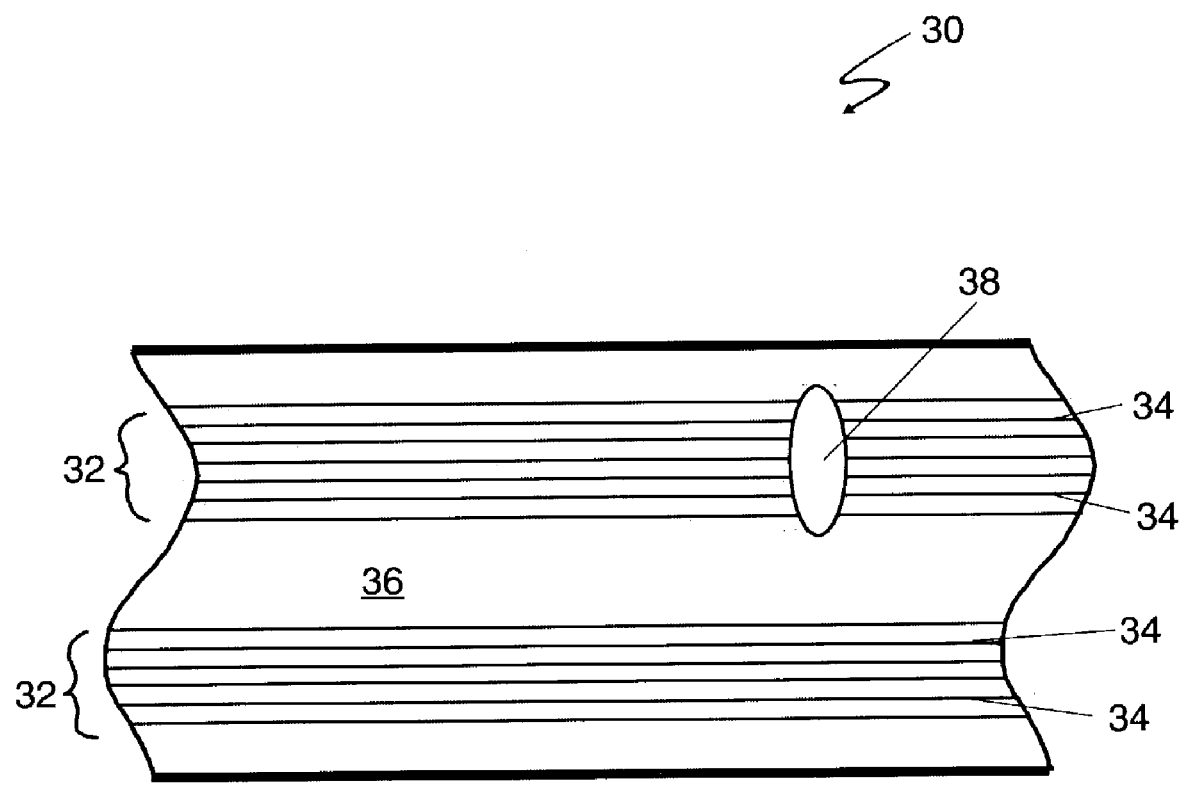
FIG. 1C is a schematic diagram of an elevational cross section of an optical storage medium having a format hologram defining distinct layer storage subvolumes, with a data bit shown recorded within a subvolume.
Figure 1D:
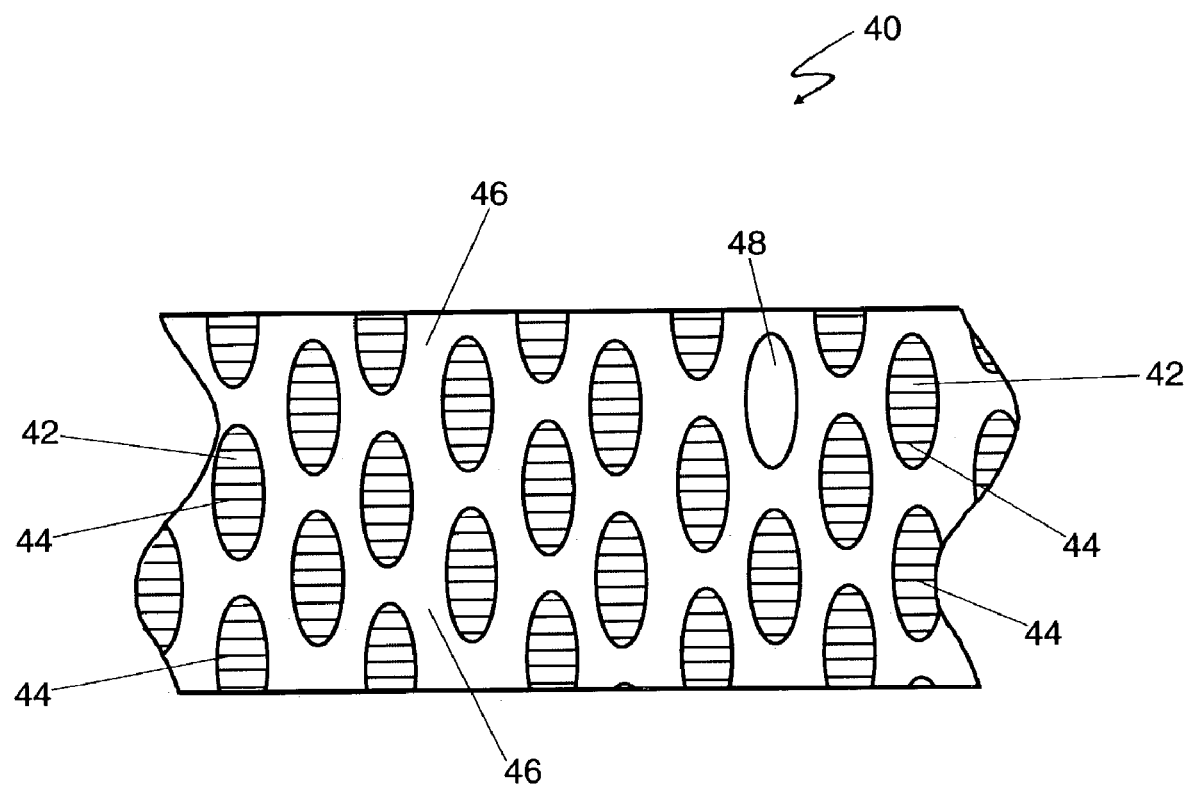
FIG. 1D is a schematic diagram of an elevational cross section of an optical storage medium having a format hologram defining plurality of tube storage subvolumes, with a data bit shown recorded within a subvolume.
Figure 1G:
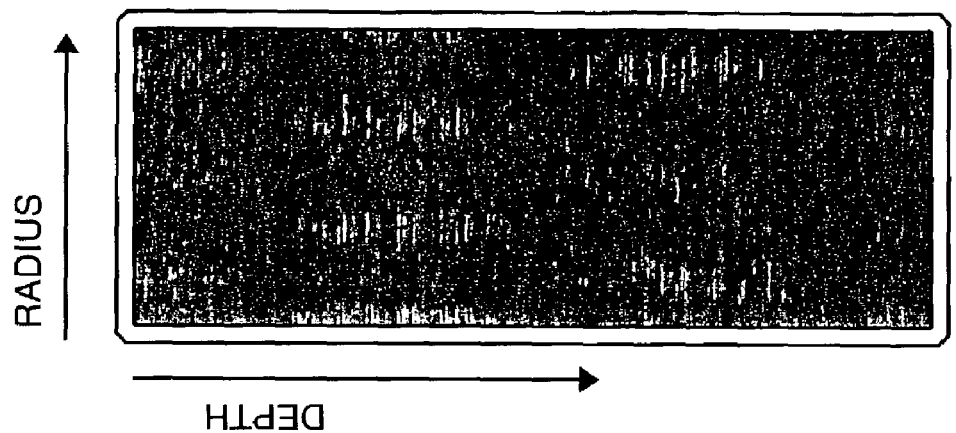
FIG. 1G is a cross sectional view of the grating structure of the four constituent format hologram of FIG. 1C.
Figure 1F:
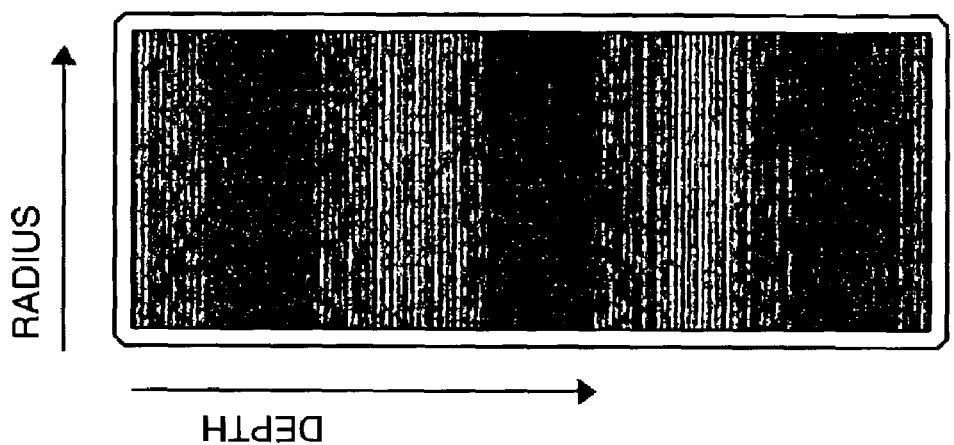
FIG. 1F is a cross sectional view of the grating structure of the two constituent hologram of FIG. 1B.

In one embodiment of the present invention, grating fringes 24 are altered by changing the fringe spacing and/or changing the index of refraction. In another embodiment deletion or partial deletion of the hologram reduces the contrast of the holographic fringes. The schematic in FIG. 1B is intended to show a generic alteration of the format hologram 21 at a bit location 23, which may be a fringe deletion, a local alteration of grating fringes 24, or other types of alteration. FIG. 1H illustrates an exaggerated change in fringe spacing within the data storage location according to an embodiment of the present invention.

The format holograms 11, 21 of FIGS. 1A and 1B can be used to store data at multiple layers within the volume of a bulk medium. Layer and/or track definition can be used to predetermine layers and/or tracks for data storage location and generally a more complex format hologram grating structure than the planar structure shown in FIGS. 1A and 1B. These complex format hologram grating structures can aid in the identification and location of specific layers and/or tracks.

Spatially modulated refractive index profiles with structure can be generated by superimposing more than one distinct hologram grating. FIGS. 1C and 1D are schematic diagrams illustrating cross sectional views of periodic spatially modulated refractive index profiles having more than one distinct hologram grating. The index profile illustrated in FIG. 1C depicts an optical storage medium 30 having a plurality of distinct layer storage subvolumes 32 stacked along the depth of the holographic storage material 30. Each layer storage subvolume 32 is characterized by the presence of reflective fringes 34 of the spatially modulated refractive index profile, while the space 36 between adjacent subvolumes 32 is characterized by relative lack of variation in the index of refraction within the medium 30. Thus, each layer storage subvolume 32 is more reflective than the space 36 between the volumes. The spatial variation of the index of refraction along the depth of the medium 30 is characterized by at least two closely-spaced hologram grating vectors. Preferably, data are recorded within layer storage subvolumes 32. A data bit 38 is illustrated as a local alteration of the index profile. The spacings between fringes 34 and the space 36 between adjacent subvolumes 32 are by way of example and, therefore, are not depicted to scale.

The spatially modulated refractive index profiles illustrated in FIG. 1D depict a storage medium 40 having a plurality of distinct storage subvolumes 42 arranged in concentric tubes throughout the volume of the bulk storage medium 40. This figure illustrates a cross-sectional view of the depth and radius of the medium 40; in disk media the tubes extend circumferentially into the plane of the cross-section. Each tube storage subvolume 42 is characterized by the presence of reflective fringes 44 of the spatially modulated refractive index profile, while the space 46 between adjacent subvolumes 42 is characterized by relative lack of variation in the index of refraction within the medium 40. Thus, each tube storage subvolume 42 is more reflective than the space 46 between the subvolumes 42. The spatial variation of the index of refraction is characterized by at least three distinct hologram gratings. Preferably, data are recorded within tube storage subvolumes 42. A data bit 48 is illustrated as a local alteration of the index profile. The spacings between fringes 44 and the space 46 between adjacent subvolumes 42 are by way of example and, therefore, are not depicted to scale.

Figure 1E:
FIG. 1E is a cross sectional view of the grating structure of the relatively simple format hologram of FIG. 1A.
Figure 1H:
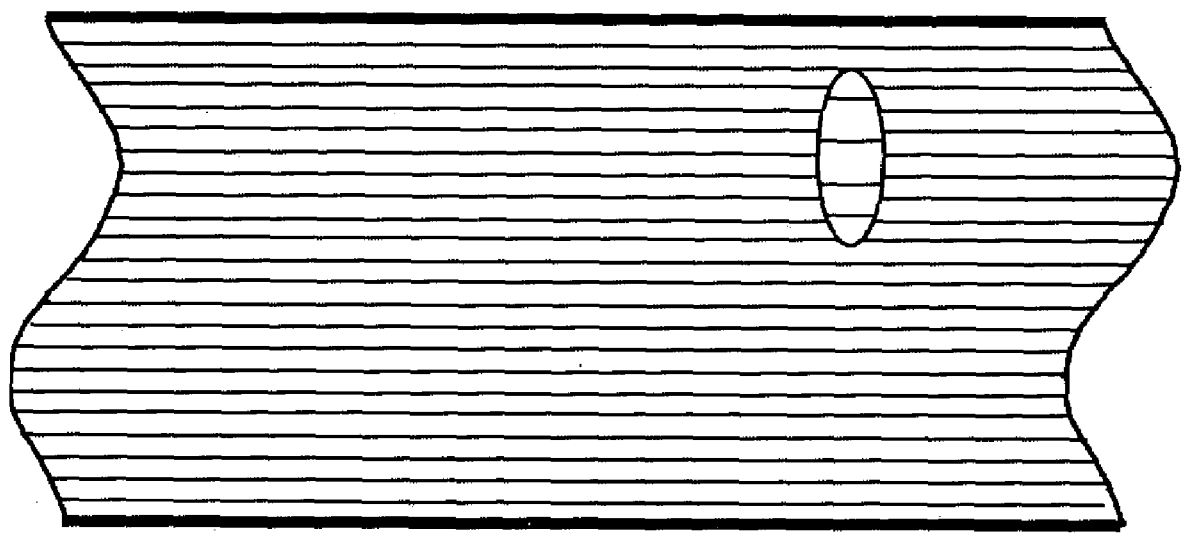
FIG. 1H is a schematic diagram illustrating an exaggerated change in fringe spacing according to an embodiment of the invention.

FIG. 1E shows a simple format hologram grating structure as illustrated schematically in FIGS. 1A and 1B. For layer-only definition, FIG. 1F shows a cross sectional view of a format hologram grating structure having two constituent holograms for track and layer definition as illustrated schematically in FIG. 1C. The radius of the format hologram grating structure of FIG. 1F is represented by the horizontal axis and the depth of the format hologram grating structure is represented by the vertical axis. FIG. 1G shows a format hologram grating structure having four constituent hologram gratings for tube track and layer definition as illustrated schematically in FIG. 1D. These constituent holograms exist throughout the entire volume and locally interfere to produce a reflection hologram grating structure with a spatially varying envelope, as shown in FIGS. 1F and 1G. Methods for generating such format hologram grating structures are omitted from this disclosure for reasons of clarity. For a detailed disclosure of generating two and four constituent format holograms and format hologram grating structures see, for example, U.S. patent application Ser. No. 09/016,382 filed on Jan. 30, 1998, in the name of inventors Hesselink et. al. entitled "Optical Data Storage by Selective Localized Alteration of a Format Hologram" and U.S. patent application Ser. No. 09/229,457 filed on Jan. 12, 1999, in the name of inventors Daiber et. al., entitled "Volumetric Track Definition for Data Storage Media Used to Record Data by Selective Alteration of a Format Hologram", the disclosures of which are incorporated herein by reference.

As noted above, the optical data storage medium of the invention preferably comprises a first, photoactive material responsive to a first, format hologram recording condition, and microparticles of a second photo-active material, responsive to a second, data writing condition, which are dispersed in the first photoactive material. The first photoactive material preferably comprises a photoactive monomer or monomer/polymer mix which is generally photosensitive to polymerization under the first, format hologram recording condition, together with an active binder material having a different refractive index than the monomer/polymer. The monomer is preferably a cationic ring-opening monomer. The first photoactive material also preferably comprises a sensitizer and photoacid generator which initiate polymerization in the medium under the format hologram recording condition. The format hologram recording condition preferably comprises interference of a signal and reference beam in a conventional manner at a first, hologram recording wavelength, with the sensitizer being specific for the wavelength(s) of the signal and reference beams. For reason of clarity, the combined ingredients or components of the first photoactive material are hereinafter collectively referred to as "photopolymer".

In one preferred embodiment, polymerization under the first, hologram recording condition is only partial and does not consume all of the monomer present in the first photopolymer. The unreacted monomer remaining after hologram recording may be used in a subsequent data writing polymerization, in connection with the second photoactive material and under the second, data writing condition, such that polymerization is locally advanced at selected data storage locations to alter the previously recorded format hologram.

In one preferred embodiment of the invention, the second photoactive material comprises microparticles which absorb light and thermally initiate polymerization, under the second, data writing condition, to write or record at selected data storage locations within the medium. In this embodiment, the second, data writing condition preferably comprises a wavelength, different from that used for format hologram recording, for which the light absorbing microparticles are particularly sensitive or responsive. Preferably, the light absorbing microparticles include a thermal acid generator (TAG) adsorbed onto, bonded to, or otherwise associated with the microparticles. The light absorption by the microparticles generates heat which is transferred to the thermal acid generator, which in turn thermally generates an acid that initiates polymerization at selected data storage locations.

The data writing is non-holographic, and is carried out using a single data writing or storage beam which is directed towards selected data storage locations within the optical medium. The data writing occurs as localized polymerization at the selected data storage location, which alters or deletes microlocalized portions of the format hologram at the selected data storage locations. The hologram recording of the photopolymer occurs under a first wavelength-specific condition, and the subsequent data storage polymerization is carried out under a second, different wavelength-specific condition. In other words, the hologram recording polymerization is specifically sensitive to a first, hologram storage wavelength, while the data writing polymerization is specifically sensitive to a second, data writing wavelength.

The light absorbing microparticles are dispersed homogeneously in the photopolymer medium for the purpose of initiating the chemistry that allows for bit-wise data recording at selected data storage locations at multiple depths within the storage medium. The use of such microparticles, typically an insoluble material such as a pigment, on the order of 10 nanometers in diameter or less, allows for the heat induced by the absorption of light in the media during photo-thermal initiation to be concentrated at desired data recording locations. This characteristic of the microparticles improves storage density within the optical data storage medium. Each microparticle is highly absorbing and can be heated to elevated temperature, yet the collection of dispersed particles within the media, because of their small size, does not lead to substantial light scattering or strong bulk absorption. Thus, the use of microparticles in three-dimensional holographic data storage enables all depth locations within the storage medium to have near equal access to light, meaning no single depth location will tend to absorb more than a small fraction of the incident light.

The photopolymer used as the first photoactive material of the invention is preferably a photopolymer such as those disclosed in U.S. Pat. No. 5,759,721, issued Jun. 2, 1998 entitled "Holographic Medium and Process for Use Thereof" by inventors Dhal et.al., "Holographic Recording Properties in Thick Films of ULSH-500 Photopolymer", D. A. Waldman et al., SPIE Vol. 3291, pp. 89–103 (1998), in "Determination of Low Transverse Shrinkage in Slant Fringe Grating of a Cationic Ring-Opening Volume Hologram recording Material," Waldman et al., SPIE Vol. 3010, pp. 354–372 (1997), "Cationic Ring-Opening Photopolymerization Methods for Volume Hologram Recording", D. A. Waldman et al., SPIE Vol. 2689, pp. 127–141 (1996), "Holographic Medium and Process," by Dhal et al., WO 97/44714 (1997), "Holographic Medium and Process," by Dhal et al., WO 97/13183 (1997), and "Holographic Medium and Process," by Dhal et al., WO 99/26112 (1999), the disclosures of which are incorporated herein by reference. Photopolymers of this type include generally one or more cationic ring opening monomers, a sensitizer, a photoacid generator (PAG), and an active binder. The formulation of preferred photopolymer media, together with the data writing polymerization initiator, is described in detail below. Generally, a variety of photopolymers may be used with the invention, and numerous examples of suitable photopolymers are described in detail by R. A. Lessard and G. Manivannan (Ed.) in "Selected Papers on Photopolymers", SPIE Milestone Series, Vol. MS 114, SPIE Engineering Press, Bellingham, Wash. (1995), the disclosure of which are incorporated herein by reference. The first photoactive material may alternatively comprise a glass or crystalline material.

The preferred photopolymer as described in the above references provides a monomer/polymer having a relatively low refractive index and an active binder of relatively high refractive index. Photoinduced polymerization of the monomer under the hologram recording condition induces phase separation of the monomer/polymer and active binder to form low and high refractive index regions to record the hologram. Subsequent photoinduced polymerization under the second, data writing condition is carried out at selected, localized data storage locations in connection with the light absorbing microparticles, and results in further phase separation of the monomer/polymer and active binder at the selected data storage locations, which in turn results in alteration of pre-written format hologram. The term "active binder" is used herein to describe a material which plays an active role in the formation of a holographic grating as well as the data writing by alteration of the holographic grating. That is, the holographic recording process and data writing process impart a segregation of active binder from monomer and/or polymer. The active binder is appropriately chosen such that it provides a periodic refractive index modulation in the photopolymer. An active binder, in this sense, can be differentiated from the typical use of inert binder materials in photopolymers to impart mechanical properties or processability. The active binder may additionally serve other purposes, such as those of a conventional inert binder.

Polymerization of the photopolymer for hologram recording is initiated when light of a specified, hologram recording wavelength, in accordance with the hologram recording condition, is absorbed by the sensitizer in the photopolymer. Upon absorption of a photon of light, the sensitizer transfers an electron to the PAG in the photopolymer. The electron transfer initiates acid generation via the PAG. This acid generation provides for the mechanism whereby polymerization occurs resulting in the formation of the format hologram. Holograms written in cationic ring-opening monomer systems generally have periodic refractive index perturbations resulting from polymerization-induced phase separation, as noted above. The photo-induced polymerization takes place at the bright fringes and active migrates away from polymerized material to the dark fringes. In simplified terms, the monomer material moves in to the bright region of the medium while the binder material moves away from the bright region of the medium. As is known by those of ordinary skill in the art, the active binder material may be chosen such that it exhibits a different index of refraction than either the monomer or polymer. The difference in index of refraction between binder and polymer creates the index perturbation that constitutes the resulting hologram. Preferably, the sensitizer is exhausted during the polymerization process that results in the recording of the format hologram. Following this polymerization, photo-thermally induced second stage polymerization is carried out via the dispersed light absorbing microparticles at the data writing wavelength to provide data or bit writing, as related further below.

Prior to the first, hologram recording polymerization, there may initially be a precure stage wherein an initial polymerization is carried out, prior to the format grating recording and data writing polymerizations. The initial polymerization is a precure which reduces unwanted shrinkage during subsequent polymerizations, and which does not result in any phase separation of monomer/polymer and active binder.

In preparing a photopolymer as a first photoactive material in accordance with the invention, the proportions of photo-acid generator, active binder and cationic ring opening monomer may vary over a wide range and the optimum proportions for specific mediums and methods of use can readily be determined by those of ordinary skill in the art. Photopolymers of this nature are disclosed in detail in the references cited above. For example, photopolymers of the described composition can comprise about 3 to about 10 percent by weight of the photo-acid generator, about 20 to about 60 percent by weight of the active binder and from about 40 to about 70 percent by weight cationic ring-opening monomer(s). Other suitable compositions can be readily determined empirically by those of ordinary skill in the art. Additionally, a sensitizer may be added to the photopolymer material to allow format holograms to be recorded at a desired wavelength. Those of ordinary skill in the art will realize that the sensitizer chosen for a specific application will be suitable for the corresponding photopolymer. The sensitizer chosen will generally exhibit absorption at the desired wavelength and, upon excitation, the sensitizer will be capable of transferring an electron to the photo acid generator.

Photoacid generators used in these photopolymer include are 4 octylphenyl(phenyl)iodonium hexafluoroantimonate, bis(methylphenyl)iodonium tetrakis pentafluorophenyl)borate, cumyltolyliodonium tetrakis pentafluorophenyl)borate or cyclopentadienyl cumene iron(II) hexafluorophosphate. The sensitizer for the photoacid generators is preferably 5,12 bis(phenyl-ethynyl)naphthacene. The monomer is usually a difunctional monomer such as 1,3-bis[2-(3{7 oxabicyclo [4.1.0]heptyl})ethyl]tetramethyl disiloxane, which is available from Polyset Corp. under the name PC-1000™, and/or a tetrafunctional monomer such as tetrakis[2(3{7-oxabicyclo[4.1.0]heptyl})ethyl(dimethylsilyloxy)silane, which is available from Polyset Corp under the name PC-1004™. The active binder is typically Dow Corning 710™ poly (methylphenylsiloxane) fluid, Dow Corning 705™ 1,3,5-trimethyl-1,1,3,5,5 pentaphenyltrisiloxane, and/or a like silicone oil. The above combined ingredients are generally referred to as "photopolymer". A second photoactive material in microparticle form is dispersed in the photopolymer as described below.

The light absorbing microparticles comprising the second photoactive material of the invention are typically formed from dye or highly pigmented materials, together with a thermal acid generator or TAG. In a presently preferred embodiment of the present invention the microparticles are carbon black micro particles. For example, carbon black such as Monarch 700, manufactured by the Cabot Corporation of Boston, Mass. or Raven 5000 manufactured by the Columbian Chemical Company of Marietta, Ga. may be used in the present invention. By way of example, suitable microparticles will characteristically be (1) less than or about 20 nanometers in diameter, (2) have a linear absorption coefficient on the order of $1\times10^5$/cm, (3) have a non-emissive excited state of less than or about 1 nanosecond, (4) have a chemically functionalizable or physi-sorbent surface, and (5) be capable of dispersion throughout a bulk media. The microparticles of the present invention will typically be capable of being heated rapidly (less than 10 nanoseconds) and intensely ($\Delta T$ greater than 1000K) by the absorption of light under the data writing condition, to provide subsequent rapid conversion of the light energy into heat. This rapid and intense heating thermally initiates polymerization in close proximity to the microparticle's surface.

Essential to the use of microparticles in three-dimensional optical data storage is the ability to ensure that the microparticle dispersions are of low agglomeration, high stability, high optical density and high optical quality. Particle agglomeration is undesirable and results in increased light scattering.

In accordance with the present invention, a method for producing high optical quality carbon black dispersions in a photopolymer via surface functionalization is set forth herein. The following is a specific example of preparation of TAG-treated carbon black microparticles for use as the second photoactive material of the invention, which are sensitive to wavelength specific data writing condition. The carbon black microparticles in this example may be used as received from the above-identified sources. As an initial step, carbon black microparticles are added to a monomer which, in this example, is the difunctional 1,3-bis[2-(3{7-oxabicyclo [4.1.0]heptyl}) ethyl]-tetramethyl disiloxane, manufactured under the name PC-1000™ sold by the Polyset Plastics Company of Mechanicsville, N.Y., as noted above. The PC-1000™ monomer from Polyset Corp. is dried prior to use by passage through activated silica (high purity grade, 70–230 mesh) which has been heated for two days at 155 degrees C. under dry atmosphere.

The desired loading of the carbon black into the monomer will typically be 0.1–0.2% carbon black by mass, and thus 0.1–0.2% w/w is added to PC-1000™ that has been processed as described above. To this mixture a trimethoxy silane derivative is added that serves as a surface functionalization agent. The trimethoxy silane derivative adsorbs and/or bonds covalently to the carbon black particles and stabilizes particle dispersion. The trimethoxy silane derivative used in this example is trimethoxy (2-(7-oxabicyclo (4.1.0) hept-3-yl)ethyl)silane, which is shown in the molecular structural drawing of FIG. 2, and which is available from the Sigma-Aldrich Corporation of St. Louis, Mo. The trimethoxy silane derivative is used as received and is added to the carbon black-monomer mix at an amount of about five times the mass of the carbon black present in the mix. The resulting formulation is mechanical milled as a means of breaking apart any carbon black aggregates. In this example, the milling step is carried out using sonication (approximately 20 k Hz, 95–55 Watts for 20 hours), for 24 hours by ball milling employing a SPEX 8000 mixer mill, or by homogenization. The sonication, ball milling and homogenization processes are well known methods in the art for eliminating aggregation of particles. Following milling, the resulting formulation is filtered through a 100 nanometer filter to insure the removal of oversized particles, to provide a monomer-carbon black mix suitable for use in formulating a photopolymer medium in accordance with the invention. Active binder material, sensitizer and photoacid-generators are added to the filtered formulation as described below to form the photopolymer medium.

Figure 2:
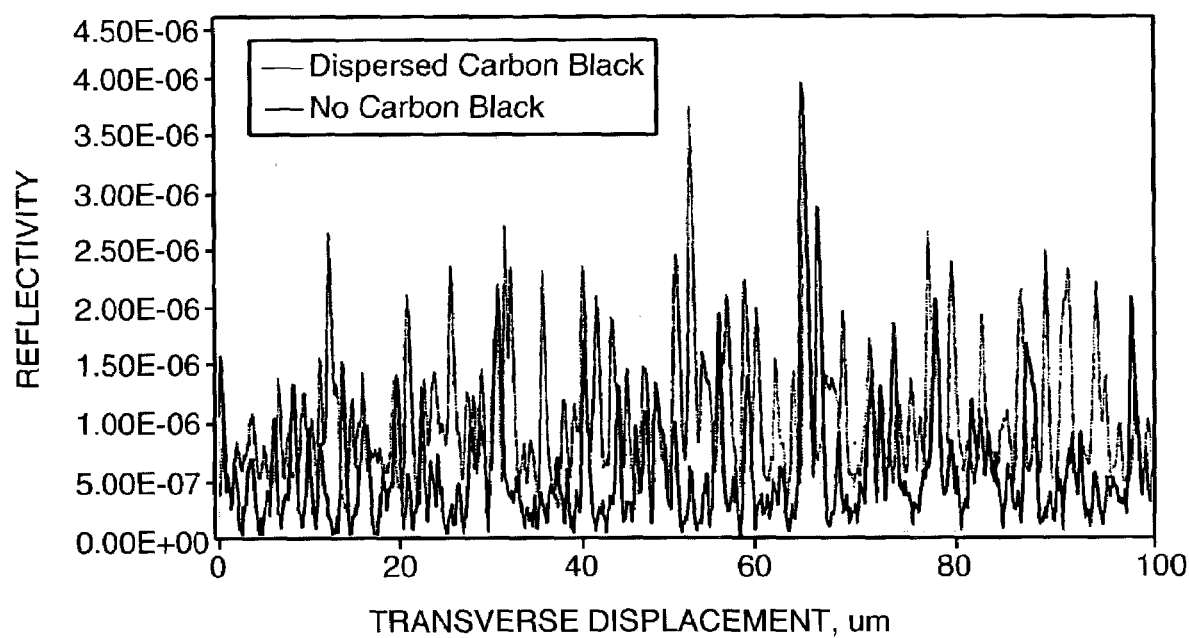
FIG. 2 is a plot of reflectivity versus transverse displacement for media comprising dispersed carbon black and a media comprising no carbon black.

The surface functionalization of carbon black microparticles in the preceding dispersion example has been confirmed by Fourier Transform Infrared (FT-IR) analysis as shown in FIG. 2. The dispersion quality has been confirmed by back scatter of 658 nanometer laser light. FIG. 2 graphically illustrates the back scatter of the above formulation after polymerization in a 125 micron thick cell against the back scatter from an equivalent formulation in the absence of carbon black. The polymerization shown has been initiated by thermolysis of an iodonium salt. Notable in FIG. 2 is the disappearance of the silicon-methoxy band at 1084 cm−1 and the appearance of the Si—O—Si band at 1117 cm−1. These changes in the FTIR spectra confirm the surface functionalization of the carbon black microparticles in the dispersion.

The PC-1000™ monomer used in the above example may be replaced in part by PC-1004™ tetrafunctional monomer, which is also available from Polyset. Thus, carbon black may be added to a monomer mix of PC-1000™ and PC-1004™, in the same manner as described above. The PC-1004™ is dried prior to use in the manner described above for PC-1000™.

The following is a specific example of preparing the photopolymer as a first photactive material, with microparticles of carbon black dispersed therein as a second photoactive material, to provide a photopolymer/carbon black microparticle optical storage medium in accordance with a preferred embodiment of the invention. The Dow 705™ active binder is purchased through Kurt J. Lesker Company and is dried for 24 hr at 155 degrees C. under vacuum prior to use. Cumyltlolyliodonium tetrakis(pentafluorophenyl)borate from Rhodia Inc. is used as received, and 5,12 bis (phenyl-ethynyl)naphthacene from Aldrich Chemical Co. is used as received. Prior to mixing with carbon black, the PC-1000™ and PC-1004™ monomers from Polyset Corp. are dried by passage through activated silica (high purity grade, 70–230 mesh) which has been heated for two days at 155 degrees C. under dry atmosphere, as noted above.

The a photopolymer/carbon black microparticle optical storage medium is made using 3–10% (w/w) of cumyltlolyliodonium tetrakis(pentafluorophenyl)borate photoacid generator, 0.002–0.06% (w/w) of 5,12-bis(phenyl-ethynyl)naphthacene sensitizer, 40–75% (w/w) of monomer—carbon black mix prepared as described above, and 20–60% (w/w) of Dow Corning 705™. The monomer mix generally includes both PC-1000™ and PC 1004™, and the weight percent of PC-1000™/PC-1004™ (difunctional monomer/tetrafunctional monomer) within the monomer mix can be varied substantially. Photopolymer having a monomer component of pure PC-1000™ as described in this example has been found to be effective. A preferred PC-1000™/PC-1004™ ratio of the monomer mix is between about 40/60 and 60/40 percent by weight, and most preferably about 50/50 percent by weight. The above ingredients of the photopolymer may be varied within the above weight percent ranges as required for particular uses and properties, such as optical media thickness, substrate composition, laser wavelength, shelf life, grating formation sensitivity, dynamic range, shrinkage, and angular selectivity, as is well known in the art. The above specific photopolymer is merely exemplary, and should not be considered limiting. Various other photopolymers may be used with the invention, and are considered to be within the scope of this disclosure.

The a photopolymer/carbon black microparticle optical storage medium is placed between glass slides separated by a desired thickness to provide a layer of medium for optical data storage. The glass plates are mechanically held apart at a 120 micron separation and then retained at that separation and held in place by a UV curable adhesive. The medium is placed between the 120 micron-separated sheets to form a layer. The glass sheets may alternatively be held apart by PTFE or polyethylene spaces of desired thickness.

The layer of optical storage medium as described above preferably is thermally pre-cured at a temperature of about 75 degrees Celsius for about 10 hours. This pre-cure provides for an initial degree of polymerization of about 30 percent and helps avoid unwanted shrinkage in subsequent format hologram recording and data writing steps. Other temperature and time period combinations may also be used that allow for an initial polymerization of about 30 percent.

In one embodiment, a format hologram grating is then recorded in the photopolymer layer using a pair of light beams with a wavelength of 532 nanometers incident on opposite sides of the optical storage device. The reflection grating spacing can be tuned for a desired data retrieval wavelength by adjusting the angles of the hologram recording beams. To use data retrieval wavelengths substantially longer than the wavelength of the recording beam, right angle prisms can be used to achieve high angles of incidence at the storage device, as is well known to those skilled in the art. Preferably, the recorded reflection grating spacing is about 1.03 _/2n, where _ is the desired data retrieval wavelength and n is a refractive index of the medium. When the reflection grating spacing is about 3% larger than _/2n, efficient resolution is achieved for bit detection using retrieval beams having a numerical aperture of about 0.4 to 0.65. Preferably, the diffraction efficiency of the grating on the order of 10 to 50 percent, and the exposure energy may be in the range of about 40 mJ/cm$^2$ to 1 J/cm$^2$. Following format hologram recording, the photopolymer may be illuminated with or exposed to white light or other light to which the sensitizer responds (e.g., 532 nm), to exhaust or bleach the sensitizer. Use of light that affects the thermal acid generator (such as UV) is undesirable and should be avoided.

The present invention advantageously provides an optical storage system and method having separate, independent format hologram writing and data writing mechanisms to allow optimization of data writing separately from format hologram recording. In its most general terms, the invention comprises an optical medium having a first, photoactive material responsive to a first, format hologram recording condition to cause a first optically detectable change in the medium, and a second photo-active material, responsive to a second, data writing condition to undergo a second optically detectable change, which is dispersed or dissolved in the first photoactive material. The second, data-writing condition may be reversible such that the photoactive material is "erasable" under a third, erasing condition. The second photoactive material is preferably in the form of microparticles, microdroplets or microcapsules which are dispersed or dissolved throughout the first photoactive material. The format hologram is recorded in the first photoactive material when the optical medium is subject to the first, format hologram recording condition, and the data writing is subsequently carried out separately. In connection with the second photoactive material, under the second, data writing condition. The separate formal hologram recording and bit writing functions provided by the invention allow independent optimization of format hologram recording and bit writing.

Preferably, the resulting hologram is then fixed to render the medium insensitive to further holographic exposure at the wavelength of the format hologram recording condition. Fixing can be accomplished by exposure to white light or exposure to the same wavelength light used to record the format hologram. If photochromic or thermochromic material are used as the first photoactive material of the medium, the absorption may be subsequently changed by appropriate illumination or heating, respectively.

Additional methods for format hologram recording are described in co-pending U.S. patent application Ser. No. 09/016,382, "Optical Storage by Selective Localized Alteration of a Format Hologram and/or Retrieval by Selective Alteration of a Holographic Storage Medium" to Hesselink et al., filed Jan. 30, 1998. The configuration of the format hologram may vary as required for particular uses of the invention, to provide different formats for subsequent data writing. A variety of complex format hologram grating structures, including tube, layer and cylindrical shell hologram grating structures, are described in co-pending U.S. patent application Ser. No. 09/229,457, filed on Jan. 12, 1999, to Daiber et al.

Additional examples of preferred photopolymer compositions are also described in U.S. patent application Ser. No. 09/364,552, entitled "METHOD AND APPARATUS FOR OPTICAL DATA STORAGE AND/OR RETRIEVAL BY SELECTIVE ALTERATION OF A HOLOGRAPHIC STORAGE MEDIUM", filed in the names of Lipson et al. on Jul. 29, 1999, U.S. patent application Ser. No. 09/364,324, entitled "OPTICAL STORAGE MEDIA AND METHOD FOR OPTICAL DATA STORAGE VIA LOCAL CHANGES IN REFLECTIVITY OF A FORMAT GRATING", filed in the names of Lipson et al. on Jul. 29, 1999, U.S. patent application Ser. No. 09/364,323, entitled "OPTICAL STORAGE MEDIA AND METHOD FOR OPTICAL DATA STORAGE VIA LOCAL CHANGES IN REFLECTIVITY OF A FORMAT GRATING", filed in the names of Sochava et al. on Jul. 29, 1999, and U.S. Provisional Patent Application Ser. No. 60/146,519, entitled "OPTICAL DATA STORAGE SYSTEM AND METHOD", filed on Jul. 30, 1999 in the names of Hesselink et al., the disclosures of which are incorporated herein by reference.

In accordance with the invention, a method for writing data in connection with light absorbing microparticles under a second, data writing condition, via polymerization initiated by microparticle, due to photoinduced heating. The data writing process begins when a data writing beam of light of a specified intensity and wavelength is highly focussed into the optical data storage medium at a data storage location and is absorbed by the dispersed microparticles. The microparticles, upon absorbing the light, effectively and rapidly convert the light to heat, which is transferred to the associated thermal-acid generators (TAGs) This heat transfer in turn releases a proton from the TAG and, thereby, provides for acid generation. The acid generation provides for the mechanism whereby polymerization adjacent to the microparticles occurs, via cationic ring opening polymerization, resulting in the recording of a data bit within the format hologram at the irradiated data storage location. At the focus of the data writing beam, substantial polymerization draws in and polymerizes the monomer material, and the resulting diffusion segregates out of the focus region at least a portion of the active binder material, thereby shifting indices of refraction. In effect, the diffusion of monomer and active binder serves to alter or delete holographic fringes that were previously recorded during hologram recording. Thus, a data bit in the form of local format hologram deletion is due to a change in the profile of the index of refraction resulting from diffusion caused by polymerization under the data writing condition.

As a specific example of the data writing process in accordance with the invention, a photopolymer comprising carbon black nanoparticles of about 10 nm in diameter is prepared, and format hologram recording is carried out in the manner described above. Data recording is carried out using laser operating at a wavelength of 658 nm in the range of from about 600 mW to 1 W. The laser is focused to a numerical aperture of about 0.5 and pulsed for about 3 ns. A data bit can be recorded as a local deletion in a format hologram after exposure to about 75 pulses at a pulse repetition rate of about 10–30 Hz.

Generally, the rate of photothermally initiated acid generation during the data writing polymerization is exponential with respect to temperature, so that this rate is nonlinear with respect to light intensity. Therefore, during first stage polymerization, i.e. the hologram recording stage, microparticles do not absorb sufficient light to initiate substantial thermal-acid generation. However, thermal curing at substantial temperatures or prolonged heating at lower temperatures may lead to undesired activation of the TAG material and is thus undesirable.

Figure 3:
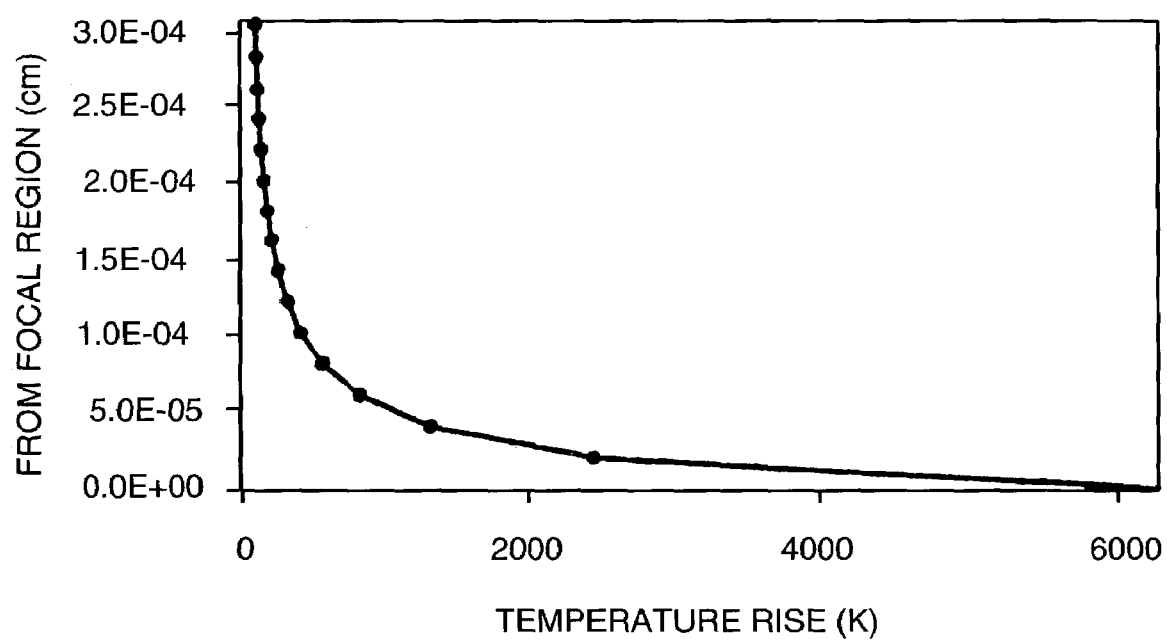
FIG. 3 is plot of temperature rise as a function of the distance removed from the focal point in an optical data storage medium comprising dispersed nanoparticles in accordance with a presently preferred embodiment of the present invention.

The second, data writing condition is preferably wavelength specific, and comprises a wavelength of 658 nanometers, with a highly focused 50 mW beam with a 10 nanosecond exposure at a data storage location. Using 10 nanometer diameter microparticles exposed to a highly focussed 50 mW, 658 nm laser for 10 ns duration, it is possible to determine the temperature rise induced in the microparticles. This estimation takes into account the reasonable assumptions known in the art regarding molar absorptivity and neglecting the complex problem of heat flow from the microparticles. FIG. 3 shows the temperature rise as a function of the position away from the focal point in the optical data storage medium. The drop in temperature rise as a function of distance from the focal region indicates the spatial control of this approach to recording data within the medium.

Figure 4:
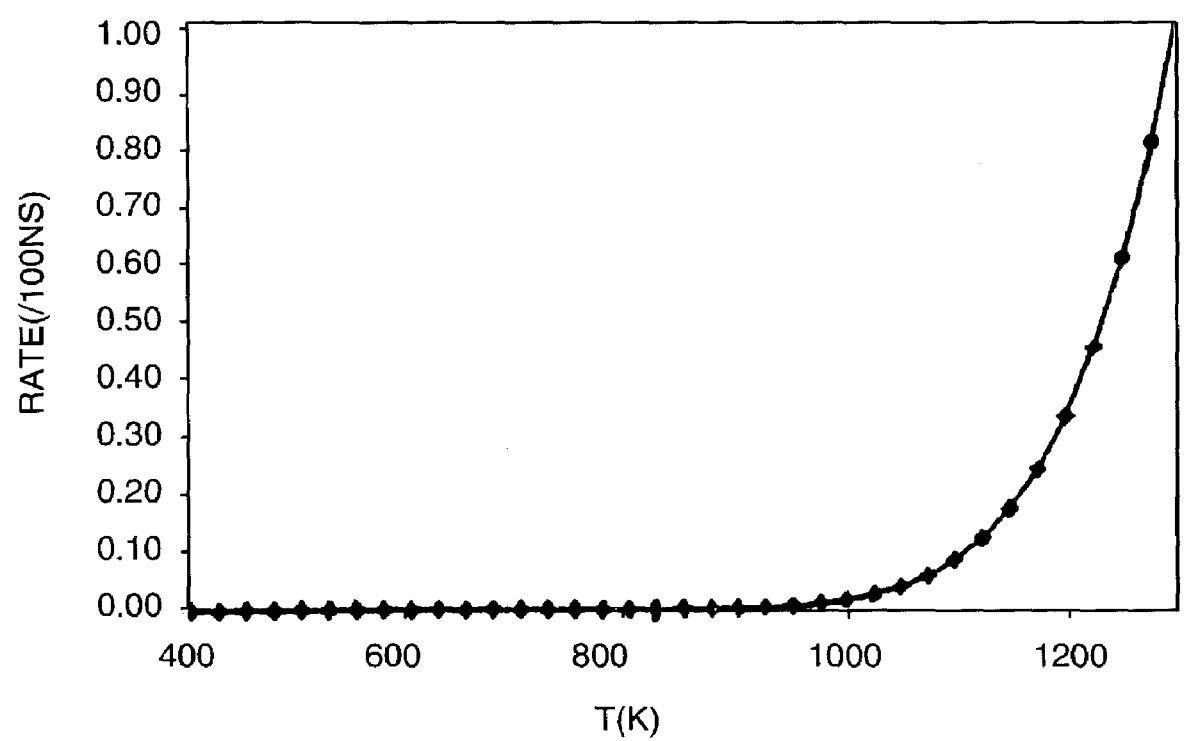
FIG. 4 is a plot of the rate of chemical reaction as a function of temperature in an optical data storage medium comprising dispersed nanoparticles in accordance with a preferred embodiment of the present invention.

FIG. 4 shows the plot of the rate of chemical reaction per 100 ns as a function of temperature. The rate of a chemical reaction as a function of temperature can be predicted using the Arrhenius equation: rate=$A*e^{-Ea/RT}$, where A is the Arrhenius A-factor, $E_a$ is the activation barrier, R is the universal gas constant, and T is the temperature. FIG. 4 assumes a reasonable values for Arrhenius A-factor, A=1e13/sec and activation barrier, $E_a$=150 kJ/mole. At 1300 K, the half life of the chemical reaction is 100 ns, but the rate is essentially zero at room temperature. This indicates that in order to write a bit of data in 10–100 ns in a material displaying values similar to those displayed in this instance, it is necessary to obtain a temperature rise of 1000 degrees K in the dispersed microparticles.

Low bulk absorption through the entire thickness of the medium is required to assure that all depths of the medium may be accessed with approximately equal efficiency This requirement limits the number of microparticles that may be dispersed in the media. Therefore, the heat generated when the microparticle rapidly absorbs photons of light must be sufficient to initiate the requisite chemical reaction.

The carbon black microparticles comprising the second photoactive material as described above as described above may be replaced, in part or in whole, by microparticles of light absorbing dye material, or other light absorbing material capable of initiating thermal chemistry such that polymerization adjacent to the microparticles is locally advanced to provide data writing as related above. The particular dye used can be sensitive to a particular wavelength in order to provide a particular, wavelength specific data recording condition. The use of encapsulated liquid dyes and other heat generating sources within microparticles, as well as various other photoactive microparticle materials, are discussed further below.

In another embodiment of the present invention, the second photoactive material comprises microparticles of a material which undergoes a phase change under the data writing condition(s) which results in an optically detectable alteration or variation within the format hologram of the medium. The alteration may be in the microparticles of second photoactive material itself or may be associated with the photopolymer or other photoactive material which is adjacent to the microparticles of phase changing material. Phase transitions are highly thresholded processes as they cannot occur below (or above) the phase transition temperature of a material. Such phase transitions often exhibit temperature hysterysis. Thus, for example, while heating of a phase change material may induce a change from phase A to phase B at a particular temperature, the change from phase B back to phase A via cooling may occur at a different temperature.

In one preferred, embodiment of the invention the phase changing photoactive material is vanadium dioxide or $VO_2$. In this embodiment, microparticles of $VO_2$ are dispersed throughout a photoactive medium which is preferably a photopolymer of the type described above. A format hologram is then recorded in the photopolymer in the manner described above. During data writing, the $VO_2$ microparticles undergo rapid absorption of visible laser light from a write beam that heats the $VO_2$ microparticles, which in turn leads to the semiconductor to metal phase transition. In the case of $VO_2$, the phase transition temperature is 340 degrees Kelvin or 67 degrees Celsius. When in the metallic state, photons absorbed by the $VO_2$ microparticles lead to ejection or transfer electrons to a photoacid generator present in the photopolymer. The photacid generator then releases a proton to catalyze polymerization of the photopolymer adjacent to the $VO_2$ microparticles. The photopolymer used with the $VO_2$ microparticles thus will not generally require a separate photosensitizer. The locally advanced polymerization at data storage locations where the $VO_2$ microparticles have been irradiated and have undergone the phase transition results in detectable alterations in the format hologram. The alterations remain after the heated $VO_2$ microparticles have cooled and reverted back to a semiconductor phase. The hologram recording and data writing conditions are preferably wavelength specific, but may also be specific as to temperature and light intensity.

The following is a specific example of preparing the photopolymer as a first photactive material, with microparticles of $VO_2$ dispersed therein as a second photoactive material, in accordance with a preferred embodiment of the invention. The photopolymer in this example is made using 3–10% (w/w) of cumyltlolyliodonium tetrakis(pentafluorophenyl)borate photoacid generator, 40–75% (w/w) of PC 1000™/PC-1004™ (difunctional/tetrafunctional) monomer mix, and 20–60% (w/w) of Dow Corning 705™. The monomer mix generally includes both PC-1000™ and PC 1004™, and the weight percent of PC-1000™/PC-1004™ (difunctional monomer/tetrafunctional monomer) within the monomer mix can he varied substantially. Photopolymer having a monomer component of pure PC-1000™ as described in this example has been found to be effective. The preferred PC-1000™/PC-1004™ ratio of the monomer mix is between about 40/60 and 60/40 percent by weight, and most preferably about 50/50 percent by weight. As in the previously described embodiment, the above ingredients of the photopolymer may be varied within the above weight percent ranges as required for particular uses and properties, such as optical media thickness, substrate composition, laser wavelength, shelf life, grating formation sensitivity, dynamic range, shrinkage, and angular selectivity, as is well known in the art. This specific photopolymer is thus only exemplary, and should not be considered limiting. Various other photopolymers may be used with the invention, and are considered to be within the scope of this disclosure. The above photopolymer may additionally include 0.002–0.06% (w/w) of 5,12-bis(phenyl-ethynyl)naphtacene sensitizer or other sensitizer although, as noted above, the embodiment of the invention utilizing $VO_2$ microparticles does not generally require a photosensitizer.

To the above photopolymer is added 0.01 percent by volume of $VO_2$ microparticles. Suitable $VO_2$ microparticles in the 10 to 20 nanometer size range are available from Aveka Inc. of Woodbury Minn., Quantalux Inc. of Austin Tex., Nantek Inc. of Manhattan Kans., and Nanomaterials Research Co. of Longmont Colo., and may generally be used as received. The $VO_2$ microparticles from the above sources are believed to contain small amounts of $V_2O_3$ and $V_2O_5$ microparticles. These other vanadium oxide microparticles do not undergo the above described phase change, and the amount of these materials within the $VO_2$ microparticles is preferably kept to a minimum. The combined photopolymer and $VO_2$ microparticles are thoroughly mixed, and the combination is preferably filtered through a 100 nanometer filter to remove any large particles or microparticle agglomerations which would cause light scattering.

The photopolymer/$VO_2$ microparticle optical storage medium thus prepared is placed between glass slides separated by a desired thickness to provide a layer storage medium in accordance with the invention for optical data storage in the manner described above. The layer of optical storage medium is thermally pre-cured at a temperature of about 75 degrees Celsius for about 10 hours. This pre-cure provides for initial degree of polymerization of about 30 percent and helps avoid unwanted shrinkage in subsequent format hologram recording and data writing steps. Other temperature and time period combinations may also be used that allow for an initial polymerization of about 30 percent.

In the above embodiment of the invention, the format hologram recording condition and data writing condition are preferably wavelength specific. The $VO_2$ microparticle in the metallic state are generally more absorptive to green light than red light. Thus, in this embodiment a format hologram grating is recorded in the photopolymer layer using a pair of light beams with a wavelength of 532 nanometers incident on opposite sides of the optical storage device. The reflection grating spacing can be tuned for a desired data retrieval wavelength by adjusting the angles of the hologram recording beams. To use data retrieval wavelengths substantially longer than the wavelength of the recording beam, right angle prisms can be used to achieve high angles of incidence at the storage device, as is well known to those skilled in the art. Preferably, the recorded reflection grating spacing is about 1.03 _/2n, where _ is the desired data retrieval wavelength and n is a refractive index of the medium. When the reflection grating spacing is about 3% larger than _/2n, efficient resolution is achieved for bit detection using retrieval beams having a numerical aperture of about 0.4 to 0.65. Preferably, the diffraction efficiency of the format grating on the order of 10 to 50 percent, and the exposure energy may be in the range of about 40 mJ/cm$^2$ to 1 J/cm$^2$.

Once the format hologram grating is written, data writing is carried out by focussing at the desired storage location a write beam under a data writing condition which, in this case is a light wavelength of 532 nanometers and a power of 50 milliWatts. In general, the write beam used to store data and the read beam used to read data can be of differing wavelengths. As relate above, the write beam causes local polymerization, which segregates binder material (high refractive index monomer) out of the bit volume wherein $VO_2$ microparticles have been irradiated under the above data writing conditions. This spatial segregation of binder causes local alteration or erasure of the format hologram grating. Data may therefore be recorded bit-wise as local variations in the reflectivity of the format grating at selected data storage locations. The local polymerization decreases the amplitude of the refractive index modulation of the format grating in the desired storage location. As a result, the altered regions reflect substantially less light and data are represented by these decreases in the local reflectivity.

The pulse width (exposure time) required to write a bit of data in the media at a wavelength of 658 nanometers is of the order of 1 microsecond. Writing in an equivalent media at the wavelength of 514 nanometers or choosing a different suitable sensitizer with maximum absorption at the wavelength of 658 nanometers can lower the required pulse width down to a range of about 10 nanoseconds.

The data that is recorded using this example may be read with a beam having a wavelength of 658 nanometers and a power of 5 microWatts. The read beam intensities are substantially lower than write intensities so that the readout beam does not adversely affect the medium over the life of the optical data storage device.

The above example using $VO_2$ microparticles provides for data writing via local advancement of polymerization due to the properties of the metallic phase of the $VO_2$ microparticles. Following cooling, the $VO_2$ microparticles revert back to the semiconductor state.

Data writing in accordance with the invention may also be based on optical detection of a phase change within microparticles of a photoactive phase changing material. Various photoactive phase changing materials are contemplated for use with the present invention in this manner. Such materials include Indium Antimonide (InSb) in various forms, such as $In_{0.4}Sb_{06}$, GeTe, $Sb_2Te_3$, $Te_{52.5}Ge_{15.3}Sb_{33}$, $Ge_2Sb_2Te_5$, $GeSb_2Te_5$, $GeSb_4Te_7$, and other phase change materials. These materials are well know in film form for WORM applications, but have heretofore not been used in microparticle form dispersed in another photoactive material as provided by the present invention. Unlike $VO_2$ microparticles, the phase change induced by data writing in the above materials is stable following data writing. Thus, at data storage locations, the phase change material will be in a different phase following the data writing condition, and can be optically distinguished from the surrounding portions of the medium via reflection, absorption or transmission properties.

Figure 5A:
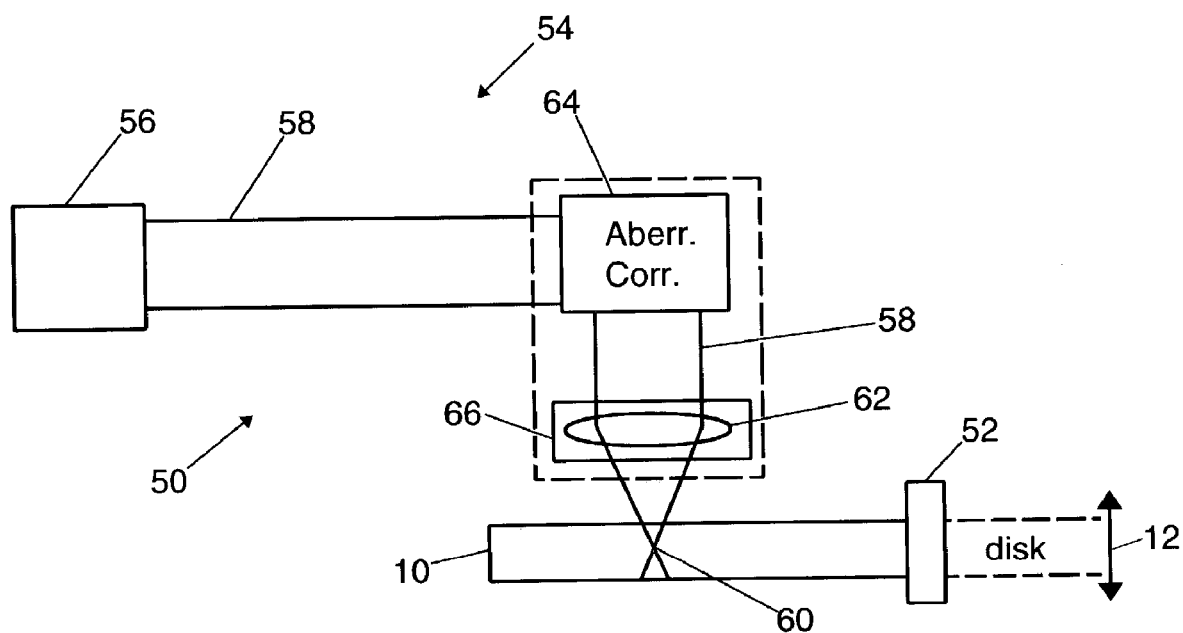
FIG. 5A is a schematic drawing of an optical data recording system in accordance with the present invention.

A schematic drawing of a presently-preferred optical data recording system 50 in accordance with the present invention is shown in FIG. 5A. The bulk recording medium 10 is disk-shaped and mounted on a rotary platform 52. The platform 52 continuously rotates the medium 10 under a recording head 54 at a high angular velocity about an axis parallel with the depth axis 12. Light source 56 generates a write beam 58, which can be focused at desired storage locations 60 within recording medium 10 using tunable optics housed within the recording head 54. To access a substantial range of depths within medium, spherical aberration correction is used, e.g., for high area density per data layer. The optics of the recording head 54 may optionally include a high numerical aperture objective lens 62 and a dynamic aberration compensator 64. Objective lens 62 generally has a numerical aperture higher than 0.25, preferably around 0.5 or higher. Higher numerical apertures translate into shorter depths of field and smaller spot sizes at the beam focus, which, in turn, translate into greater recording density. The objective lens 62 is mounted on a multiple-axis actuator 66, such as a voice-coil motor, which controls the focusing and fine-tracking of the objective lens 62 relative to the medium 10. The aforementioned components of recording head 54 are well known in the art.

When focused at a depth within recording medium 10, the write beam 58 will typically experience some spherical aberration as it focuses to a location inside bulk recording medium 10 of an index of refraction substantially different than the ambient index, such as air. The degree of these aberration effects will depend on the numerical aperture of write beam 58 and depth accessed by write beam 58. Spherical aberration causes undesirable blurring of write beam 58 at its focus, but it can be corrected using an aberration compensator 64. Many suitable aberration compensators are known in the art and may be used, and a description of the aberration compensator is omitted from this disclosure in order to avoid overcomplicating the disclosure. See, for example, U.S. patent application, Ser. No. 09/109,111 filed on Jul. 2, 1998, in the name of inventors Mark E. McDonald and Yu Chuan Lee, assigned to the assignee of the present invention, entitled "Spherical Aberration Correction Using Flying Lens and Method," for a disclosure of an appropriate aberration compensator, and U.S. Pat. No. 5,202,875, issued Apr. 13, 1993, to Rosen et al. and entitled "Multiple Date Surface Optical Data Storage System," and U.S. Pat. No. 5,157,555, issued Oct. 20, 1992, to Reno and entitled, "Apparatus for Adjustable Correction of Spherical Aberration".

Figure 6A:
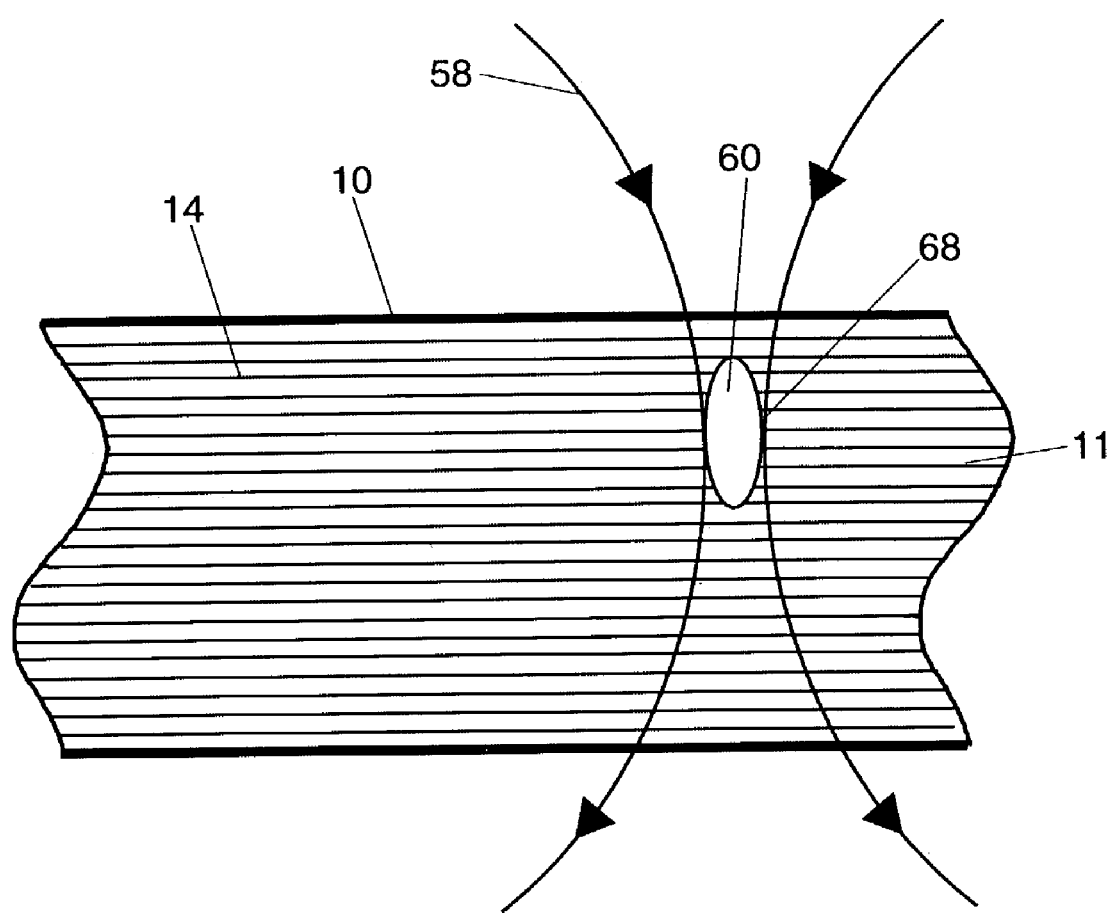
FIG. 6A is a schematic drawing of a method for writing data onto a storage location within a bulk recording medium, according to a presently preferred embodiment of the present invention.
Figure 6B:
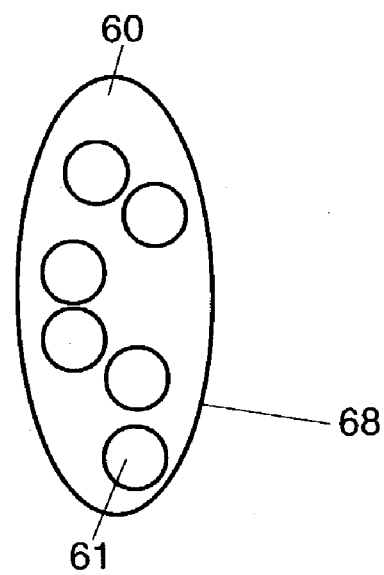
FIG. 6B is a detailed schematic drawing of a data storage location showing microparticles therein.

The data writing procedure is illustrated schematically in FIG. 6A and FIG. 6B. In order to record a bit of data, the write beam 58 of FIG. 6A is focused at one of a plurality of selectable storage locations 60 within medium 10. In general, there is no requirement that write beam 58 have the same frequency as a retrieval beam used later to read the data. As will be apparent to those of ordinary skill in the art, the storage locations 60 can be arranged in a variety of ways throughout the volume of bulk recording medium 10. They may be arranged, for example, in a 3-dimensional lattice, rectangular or otherwise, so that data can be stored on multiple layers at various depths within the bulk recording medium 10.

The write beam 58 causes an optically detectable change at data storage location 60, generally in the form of an alteration in the format hologram 11. In the above-described embodiment of the invention, local heating of medium 10 via light absorption by microparticles 61 at data storage location 60 creates a local alteration 68 at selected storage location 60. Local alteration 68 in the above embodiment is generally in the form of a local advancement of polymerization of the medium 10, which locally alters the format hologram in medium 10 by a change in refractive index at data storage location 10. In other embodiments of the invention the local alteration 68 may involve expansion or contraction of medium 10 at data storage location 60, or phase changes within the microparticles 61 at data storage location, as related further below. Changes in the mean index of refraction at data storage location 60 may also arise due to various other chemical and structural changes in the photopolymer of medium 10 which occur in connection with microparticles 61 under a data writing condition or conditions.

Figure 5B:
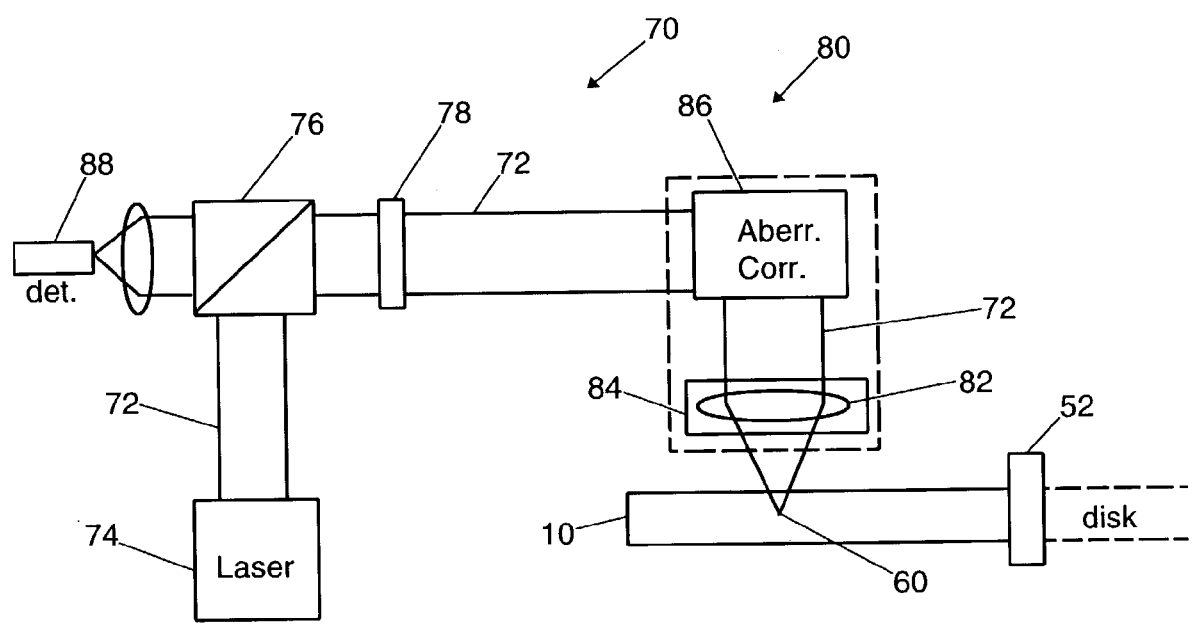
FIG. 5B is a schematic drawing of an optical data retrieval system in accordance with the present invention.

Local alteration 68 can be detected using the optical data retrieval system shown in FIG. 5B. In the above embodiment, local alteration 68 will generally be distinct from the remainder of format hologram 11 and medium 10 by having a different reflectivity In other embodiments, described below, local alteration may be detectable via a difference in color, fluorescence, phosphorescence, or other optically detectable feature associated with microparticles 11 at data storage locations 60.

In accordance with the data retrieval system 70 of FIG. 5B, a retrieval beam 72 is produced by a light source 74 and passed through a polarizing beam-splitter 76 and a quarter-wave plate 78. Polarizing beam-splitters and quarter-wave plates are preferably used instead of simple beam-splitters for reducing losses at the separation elements and to suppress feedback to the laser. As with the write beam 58, the retrieval beam 72 is focused with a retrieval head 80 including a high numerical aperture lens 82 mounted on a multiple-axis servo-motor 84 and an aberration compensator 86. Retrieval beam may be of the same wavelength, or a different wavelength, with respect to write beam 58.

Light reflected from medium 10 is measured with detector 88. In a presently-preferred embodiment of the invention, detector 88 is a confocal, depth-selective detector that includes spatial filtering optics that permit it to detect light Bragg-reflected from only those storage locations 60 at desired depths within the medium 10. Spatial filtering optics are well-known to those of ordinary skill in the art. Data retrieval system 70 may alternatively be structured and configured to detect the transmission of read beam 72 through medium 10, in cases where local alteration 68 does not involve a change in reflectivity.

Figure 5C:
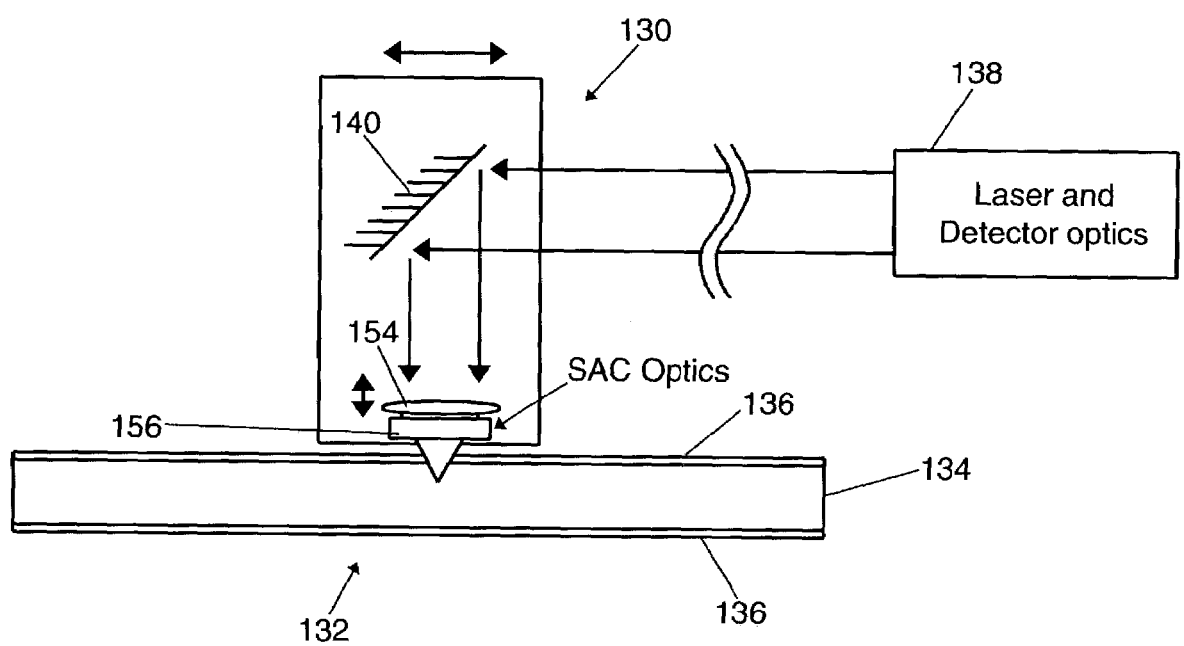
FIG. 5C is a schematic drawing of an optical data recording and/or retrieval system in accordance with the present invention.

Referring to FIG. 5C, there is shown an embodiment of the present invention in which an optical head 130 is positioned to access a storage device 132 comprising a photoactive medium 134, which further comprises a format hologram recorded therein. The photoactive medium 134 will generally comprise a first photoactive material, preferably a photopolymer, and microparticles of a second photoactive material dispersed therein, as described above. Medium is disposed between two cover layers 136 (e.g. glass) for stability and protection from the environment. Optical head 130 is used for both reading from and writing to the medium 134. The output of optical head 130 is optically coupled to laser and detector optics 138 using reflecting surface 140. An objective lens 154 in optical head 130 focuses the access beam onto the medium. A dynamic spherical aberration corrector (SAC) 156 is optionally present in the path of the beam to correct for variations in spherical aberration that arise as different depths are accessed in the medium 134. Depending on the type of spherical aberration corrector used, it may be located before or after the objective lens 154. The arrangement shown in FIG. 5C can alternatively be structured and configured to detect the transmission of a read beam through medium 134, when local alterations 68 do not involve a detectable change in reflectivity.

Figure 5D:
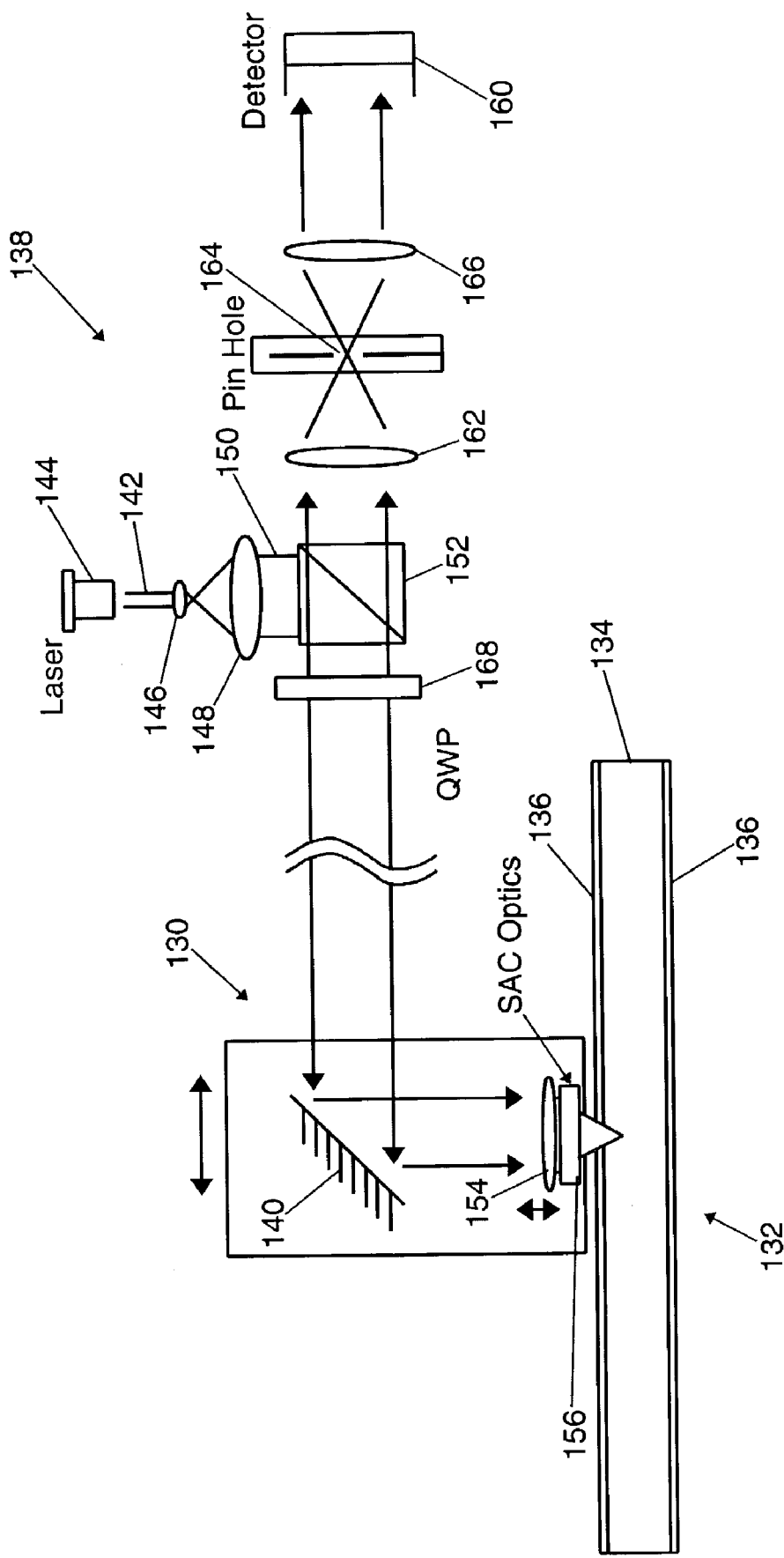
FIG. 5D is a schematic drawing of another optical recording and/or retrieval system in accordance with yet another preferred embodiment of the present invention.

Referring next to FIG. 5D, there is shown another embodiment of the present invention, with like reference numbers denoting like parts, in which laser and detector optics 138 include a confocal detector to discriminate light reflected from a desired layer. Laser illumination 142 from laser 144 for the access wavelength is expanded and directed toward the medium 134 by lenses 146 and 148. The expanded beam 150 passes through a beam splitter 152, which is present to couple the incident beam into the access path. The output of optical head 130 is optically coupled to laser 144 and detector optics 138 using reflecting surface 140. An objective lens 154 in optical head 130 focuses the access beam onto the medium. A dynamic spherical aberration corrector (SAC) 156 is optionally present in the path of the beam to correct for variations in spherical aberration that arise as different depths are accessed in the medium 134. Depending on the type of spherical aberration corrector used, it may be located before or after the objective lens 154. Light is focussed with a numerical aperture in the range of, e.g., 0.4 to 0.65 or higher. Thus, for visible wavelengths spot sizes used to access data are on the order of about 1 mm or smaller.

Light is reflected from the accessed point in the medium 134. Reflected light is returned through spherical aberration corrector 156 and the objective lens 354. Reflected light passes through the beam splitter 152 towards the detector 160. A first lens 162 focuses the light to a point of focus. A pinhole 164 is situated to admit the focused light corresponding to the accessed layer, a pinhole situated in this manner is a well-known basis for confocal detection. A second lens 166 collimates the light, which is then detected by detector 160. An optional quarter wave plate 168 inserted between a polarizing beam splitter and the material will cause substantially all of the returning light to be deflected to the detector 160. In the case of rotatable media such as a disk, rotation brings different regions of the medium into the range accessible to the optical head. The head is adjusted to position the focused beam radially to access different tracks in the radial direction and in depth to access different data layers, by use of well known positioning techniques.

Figure 7:
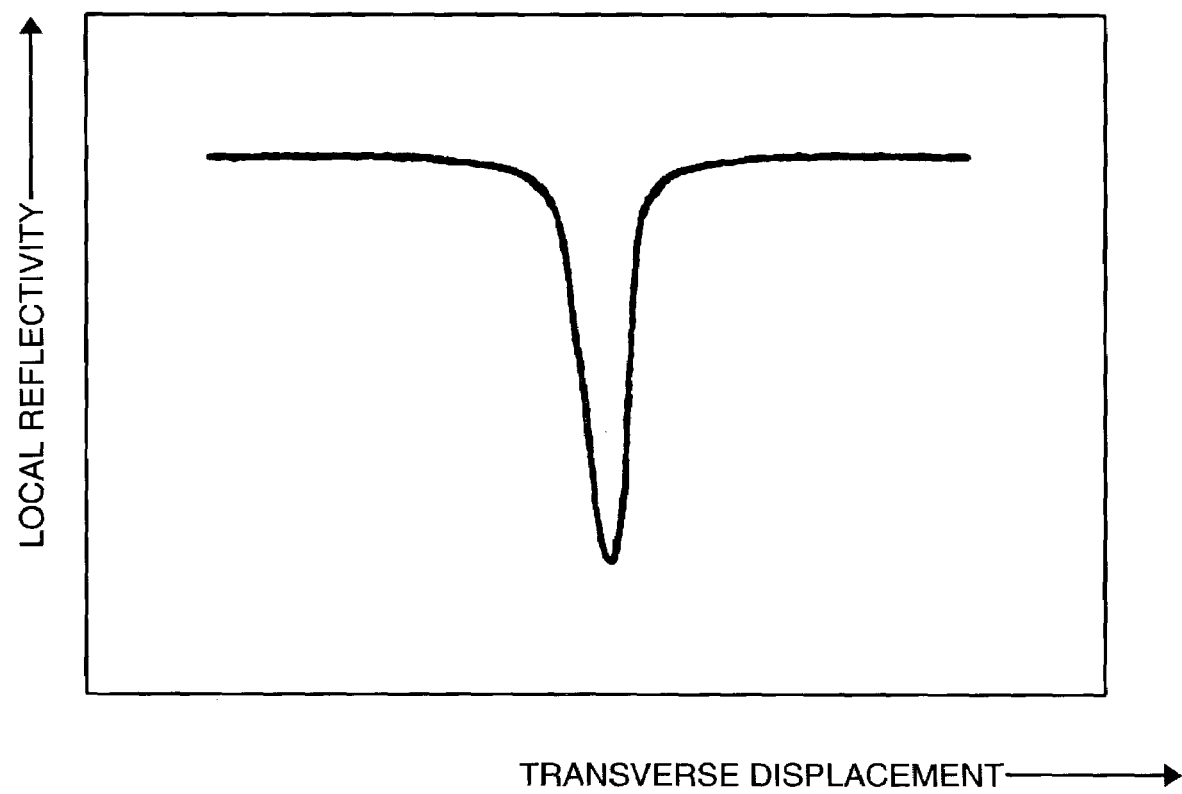
FIG. 7 is a plot showing reflectivity profile of a negative bit along a circumferential direction at a constant depth, in accordance with a preferred embodiment of the present invention.

Referring again to FIG. 5A and FIG. 6B, readout of the recorded information can be performed in at least two complementary ways. If the retrieval beam 72 is tuned to the Bragg reflection condition of the bulk recording medium 10, then the alterations 68 will reflect more light relative to the unaltered bulk recording medium 10. If the bulk recording medium 10 is spinning beneath the retrieval head 80, then the alteration 68 will appear to the detector 88 as a "negative bit," or a momentary drop in reflected intensity, as shown in FIG. 7.

In other preferred embodiments of the optical data storage medium of the invention, the microparticles may comprise photoactive liquid material as microdroplets or micro capsules. The liquid photoactive materials may comprise, for example, a substance which undergoes photoinduced heating and results in local advancement of adjacent polymerization, a photochromic or thermochromic material which undergoes a color change upon exposure to light, or any other liquid material which produces an optically detectable change when irradiated under data writing conditions.

Figure 8:
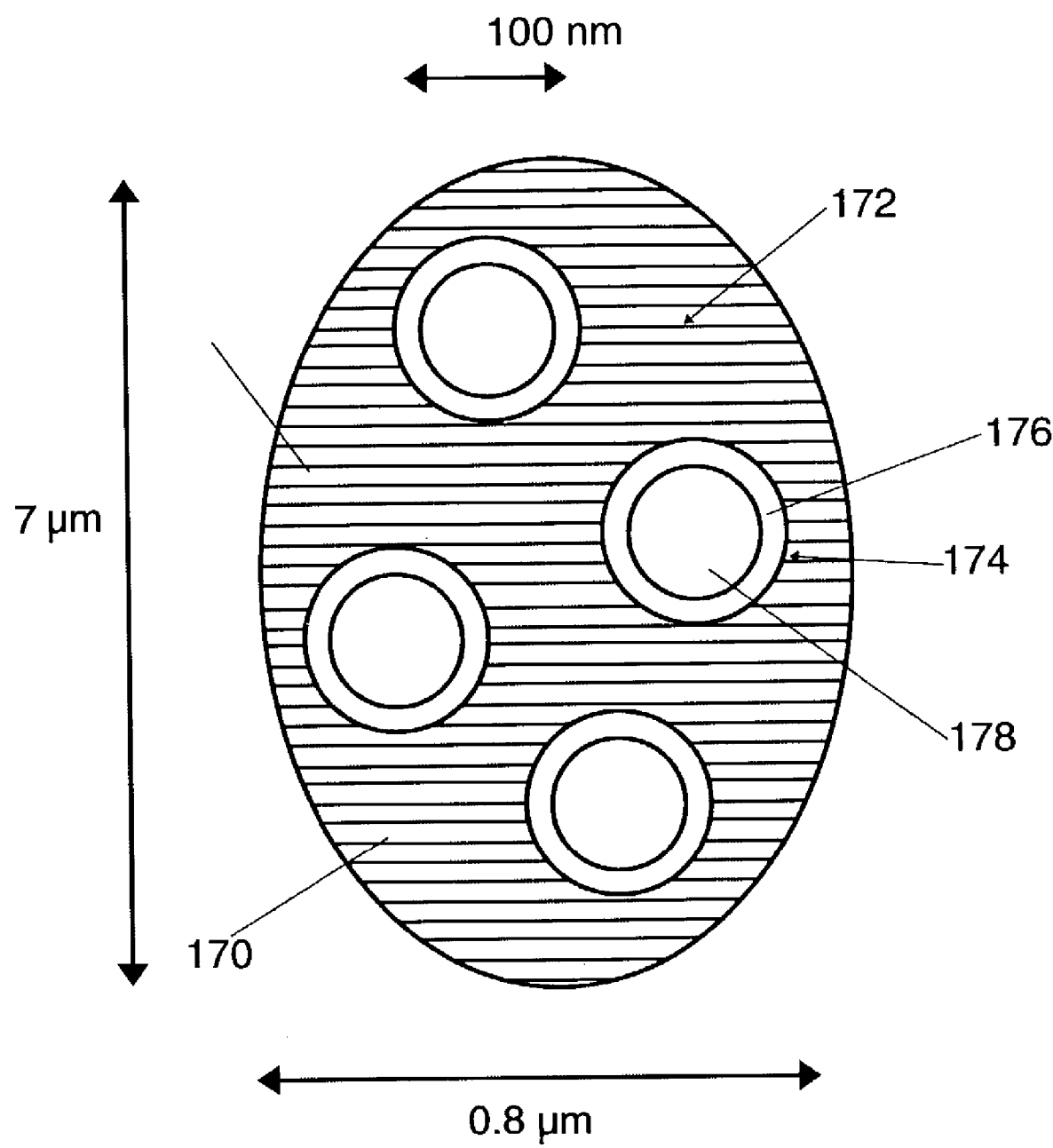
FIG. 8 is a detailed view of an optical data storage location in accordance with the present invention in which the microparticles comprise microcapsules.

Referring to FIG. 8, there is shown generally a data storage location 170 in an optical medium in accordance with the invention, wherein a first photoactive material 172 includes a plurality of microdroplets 174 of a second photoactive material dispersed therein. The first photoactive material is preferably a photopolymer of the type described above. Microdroplets 174 may be in microcapsule form and include an outer shell 176 of light absorbing material which surrounds a core 178 of catalytic heat releasing material, or material which undergoes heat induced expansion, or which otherwise undergoes an optically detectable change. The light absorbing shell 176 may comprise, for example, a wavelength specific dye doped into a liquid polymer to make the core material 178 responsive to a wavelength-specific data writing condition. In this manner, temperature nonlinearity from core 178 heating is combined with optically linear absorption from shell 176 to trigger data writing. Shell 176 may be index matched to the surrounding photoactive material 172. Microdroplets 174 preferably are evenly dispersed throughout the photopolymer medium 172. Prior to format hologram recording, photopolymer 172 can undergo a precure to prevent migration of microdroplets 174 within photopolymer 172 when polymerization occurs during hologram recording. In some embodiments of the invention, however, such a precure is omitted so that the microdroplets 174 can undergo migration towards the dark fringes of the format hologram during hologram recording, as described further below.

Microdroplets 174 are shown as exaggerated in size with respect to data storage location 170 in FIG. 8 Microdroplets 174 are of small size, preferably 100 nanometer or less in cross-section, and more preferably 20 nanometer or less in cross-section, in order to minimize optical scattering by microdroplets 174 and to allow effective heating of microcapsules 174 with relatively short exposures to light from a data writing beam, and to provide a threshold mechanism for data writing. Preferably, microcapsules 174 are of small enough size to provide a 10 nJ exposure requirement per data bit and a 25 ns exposure time per data bit. Ideally, a data storage location 170 of about 7 micron depth and 0.8 micron width would contain about 100 microcapsules, or a concentration of about 0.05% by volume of microcapsule 174. In this case, the total absorption thickness per bit during data writing would be about 200 nm, and the total optical absorption for a microcapsule containing medium with 40 subvolume layers (see FIG. 1C) would be approximately 8 microns. The absorption coefficient required for dye-containing shell 176 in this case would be 2000 $cm^{-1}$ for a temperature rise of 100° C. at 50 mW laser power. Heat release per microcapsule 174 is preferably 2.5 microjoule or greater.

The core 178 of the microcapsule may contain, in one embodiment, quadricyclane ($C_8H_7$), which undergoes a heat generating chemical reaction when heat is transferred from the light absorbing dye shell 176. Thus, light from a data writing beam is absorbed by shell 176 and converted to heat, and the heat is transferred to the quadricyclane in core 178. The heat transferred to core 178 induces a chemical reaction in core 178 that generates more heat, which in turn locally advances polymerization of photopolymer 172 in data storage location 170 in the manner described above to create an optically detectable alteration in the format hologram. Alternatively, the heat generated from core 178 may serve to "melt" the surrounding material in data storage location 170 and result in alteration or deletion of the format hologram 180 at data storage location 170. In another embodiment, microcapsule core 178 may contain a polymer which undergoes expansion upon exposure to heat transferred from light absorbing shell 176, with the expansion resulting in deformation or alteration of the format hologram 180 at data storage location 170. Other catalytic heat generating agents may also be provided within core 178 of microdroplets 174.

In another embodiment of the invention, microdroplets 174 may alternatively comprise a dye, dissolved in a polymer or other liquid, which exhibits different fluorescent properties following exposure to light under data writing conditions. In this embodiment, the detectable fluorescence from a data storage location 170 is different after exposure to the data writing condition. Microdroplets 174 of fluorescent dye are dispersed in a first photoactive medium 170 such as photopolymer, and a format hologram is recorded in the medium under format hologram recording conditions as described above. At this point, each data storage location 172, when irradiated at the absorption wavelength of the dye in microcapsules 174, will exhibit a detectable fluorescence at the emission wavelength of the dye. Selected data storage locations 172 are then irradiated under the data writing condition to change the fluorescent property of the dye in microcapsules 174. Subsequent to exposure the a data writing condition, the microcapsules 174 will exhibit a detectable difference in fluorescence in comparison to data storage locations 172 which have not been laser irradiated under the data writing condition.

In its simplest form, the data writing condition in this embodiment involves sufficient heat thermally damage the dye within microcapsules 174 or use of a wavelength which effectively photobleaches the dyes at the absorption wavelength, so that no fluorescence is produced by microdroplets 174 which have been subject to the data writing condition. Reading of data is carried out at the emission wavelength of the dye, by detecting the presence or absence of fluorescence at each data storage location 172. In this regard, Microcapsules 174 may comprise a wavelength-specific non-fluorescing dye dissolved in a polymer within shells 176 to provide heat transfer upon light absorption, and a catalytic and a fluorescing dye together with a heating agent within cores 178 of microdroplets 174. Upon irradiation at a data writing wavelength, the dye in the shells 176 transfers heat to the catalytic heating agent in cores 178, which undergo a heat generating chemical reaction to destroy the fluorescent dye within cores 178.

In another embodiment, the dye within microcapsules 174 may exhibit bistable fluorescence such that, prior to exposure to the data writing condition, the dye fluoresces at one wavelength, and subsequent to exposure to the data writing condition, the dye fluoresces at a different wavelength. Two types of dyes which exhibit such properties are spiropyrans and merocyanines, which can be photo-induced to provide an altered fluorescence. Thus, microcapsules containing spiropyran and/or merocyanine dyes may be dispersed in a photopolymer medium, and a format hologram recorded as described above. The medium would then irradiated at a data writing wavelength at selected data storage locations to alter the fluorescence wavelength of the dye microparticles in the selected data storage locations. The irradiated data storage locations could then be detected via differing fluorescence wavelength from non-irradiated data storage locations.

The dye within microcapsules 174 preferably has a high level of detectable fluorescence, such as one of the rhodamine or coumarin dyes, and more preferably a dye having a fluorescence emission wavelength of about 670 nanometers to facilitate data reading. The dye may use a non-linear fluorescence mechanism to avoid fluorescence from other layers of the optical medium. Alternatively, the dye within microcapsules 174 may exhibit a detectable phosphorescence which is changed in an optically detectable manner following exposure to the data writing condition. Where the data writing condition results in reversible photobleaching of the dye within microcapsules 174, the data writing process can be reversible to provide an erasable and re-writable medium. Once such dye is Silicon phthalocyanine (SiPC), which bleaches under red illumination to produce a green absorption. Thus data can be written using a high power green laser.

The microdroplets 174 may contain other types of liquid photoactive material which undergo changes in refractive index, polarization, or other optically detectable property following subjection to a data writing condition. In yet another embodiment of the invention, the photoactive material within microdroplets 174 comprises a liquid crystal or liquid crystalline polymer material which can undergo orientation when exposed to an electric field to create an optically detectable change in light polarization.

Polymer-dispersed liquid crystal materials are well known, and typically involve microdroplets of a nematic liquid crystal with positive dielectric anisotropy dispersed within a thin polymer film. When an electric field is applied across the film, the refractive index of the liquid-crystal microdroplets can be matched to the surrounding polymer matrix to provide a transparent state. When the field is removed, the refractive indices of the microdroplets and polymer are mismatched and the film is translucent. Liquid crystalline microdroplets have not heretofore been used, however, in connection with a format hologram with optical data storage as localized alterations in the format hologram, as provided by the present invention.

In this embodiment of the invention, microdroplets 174 of liquid crystalline material, such as 4-cyano-4'-n-butyl biphenyl, are evenly dispersed throughout a photopolymer 170. Preferably, there is no precure of the photopolymer medium 170 prior to format hologram recording, so that the immiscible microdroplets 174 of liquid crystalline material undergo migration towards the dark fringes of the format hologram during polymerization of photopolymer during format hologram recording. Thus, microparticles 174 are enriched in the dark fringes and depleted at the light fringes of the format hologram. When an electric field is applied to the medium, the polarization of liquid crystalline microdroplets 174 align with the applied field to the point that almost no diffraction off the format hologram will occur. Data can be written under conditions which thermally destroy the liquid crystalline material within microdroplets 174 at selected, irradiated data storage locations. Smectic, chiral, and other types of liquid crystalline materials may be employed in microdroplets 174.

In yet another embodiment of the invention, microdroplets 174 may comprise material which undergoes an optically detectable change in the form of photo-induced birefringence. One such class of materials are photo-addressable "side-chain" polymers having a somewhat flexible backbone with elongated rigid chromophores covalently bound to the backbone. One such group of materials are substituted azobenzene dyes attached to an acrylic or methacrylic backbone. These materials exhibit an extremely large birefringence ($\Delta n$ of about 3) which can be photo-induced by laser irradiation at green and shorter wavelengths. The birefringence has a high spatial resolution, is relatively stable, and can be addressed on a sub-microsecond time scale Thus, microdroplets of photo-addressable side chain polymers may be dispersed within a photopolymer medium, and a format hologram then recorded under conditions which do not induce the birefringence. Subsequently, data can be written by selectively irradiating data storage locations at a wavelength which induces the high birefringence in the photo-addressable polymer microdroplets 174.

In still another embodiment of the invention, the photoactive materials comprising microparticles may be magnetic or magneto-optic such that optically detectable data writing can be carried out in connection with magnetic fields, with detection of bits based on Faraday rotation of polarization of readout light at the data storage locations. In this embodiment, ferromagnetic microparticles are dispersed throughout the photoactive medium. Then the medium is subjected to a strong external magnetic field such that the individual microparticles orient their magnetic domains with the external field by rotating within the fluid medium. Next the medium is partially or fully cured while the external magnetic field is maintained, to lock in the orientations of the magnetic domains of the microparticles. Bits are recorded by exposing the medium to an oppositely oriented magnetic field while simultaneously exposing a data storage location to heating by a focussed laser beam so that the ferromagnetic microparticles at the beam waist are heated above their Curie point and can re-orient with the new magnetic field. The light beam and heating are then removed, and the data storage location is allowed to cool while subject to the new magnetic field.

The result is that the magnetic orientation of the microparticles in the irradiated data storage location is opposite to that of the microparticles in the surrounding medium, and can different orientation can be detected via polarization from the Faraday effect. When plane-polarized light passes through the medium, its polarization is rotated by the Faraday effect induced by the aligned magnetic microparticles. When focussed light passes through the medium, confocal detection can be used to detect small changes in light polarization at data storage locations. Differential interference contrast techniques can further be employed to improve the detection limits of such polarization changes. Because the Faraday rotation may be weak, amplification may be added by providing microparticles of a superparamagnetic material within the medium, as well as ferromagnetic particles. When recording a bit, the magnetic moments of the secondary, superparamagnetic particles will enhance the externally applied magnetic field and aid in aligning the primary, ferromagnetic microparticles. When the external magnetic field is removed, the superparamagnetic particles will align their magnetic moments with the magnetic moments of nearby or adjacent ferromagnetic microparticles.

Figure 9A:
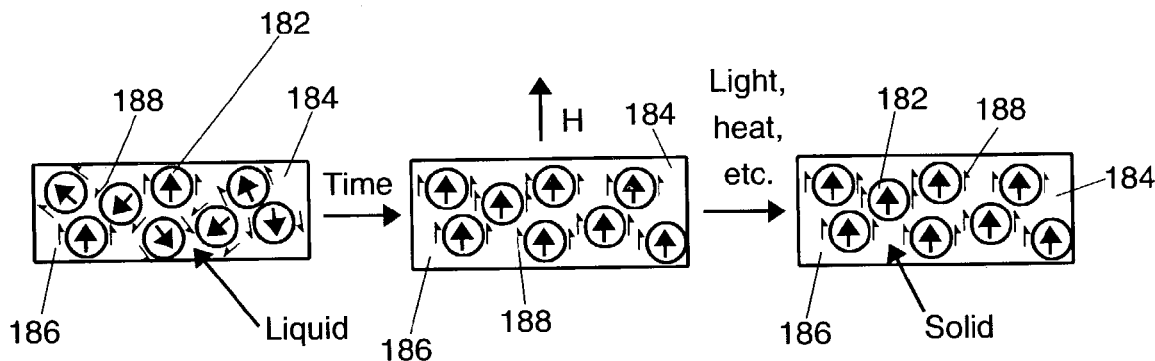
FIG. 9A is a schematic flow diagram of another alternative embodiment optical data storage medium in accordance with the present invention illustrating the alignment of magneto-optic particles.
Figure 9B:
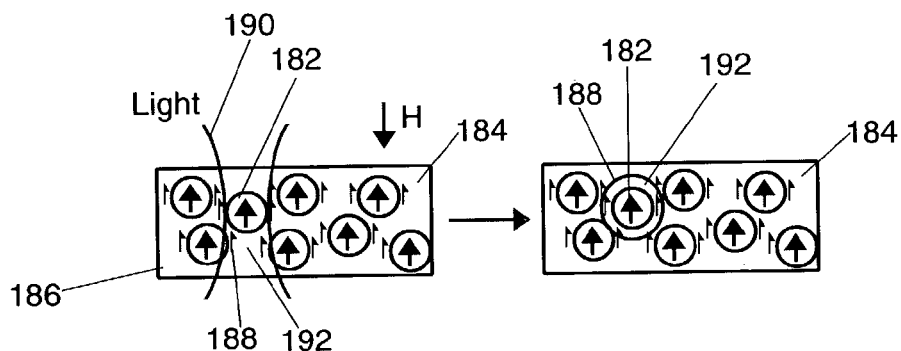
FIG. 9B is a schematic flow diagram of the optical data storage medium of FIG. 5A showing data recording to form a recorded bit.
Figure 9C:
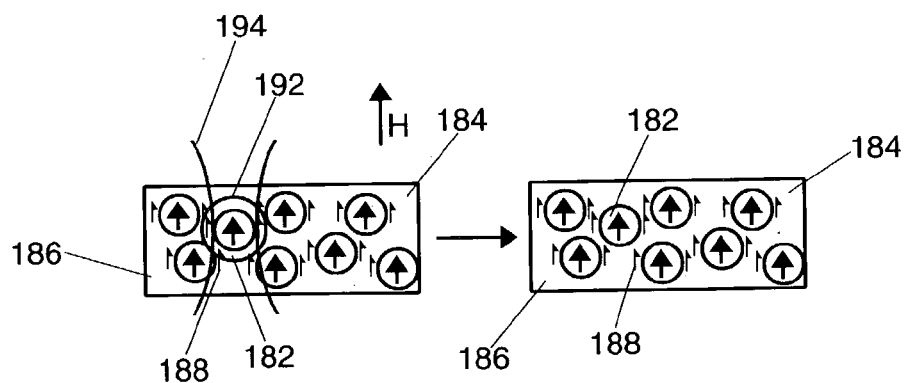
FIG. 9C is a schematic flow diagram of the optical data storage medium of FIG. 5B showing the erasure of a recorded bit.

The use of magnetic microparticles in accordance with one preferred embodiment of the invention will be more fully understood by referring to FIG. 9A through FIG. 9C. Ferromagnetic microparticles 182 are dispersed into a photoactive material 184 to form an optical data storage medium 186. Photoactive material 184 preferably comprises a liquid photopolymer of the type described above. Ferromagnetic microparticles 182 preferably comprise a rare earth-transition metal (RE-TM) alloy as microparticles having diameters of less than 10 nanometers, such as those described by Tang et al. in "Nanocomposite formation and size reduction of Terfenol-D Particles During Mechanical Milling", Journal of Alloys and Compounds, Vol. 250, p. 482 (1997). Preferably microparticles 188 of a superparagmetic material such as $Fe_3O_4$ are also included with medium 186 to provide amplification of Faraday rotation as described above. Superparamagnetic microparticles 188 preferably are similar in size to ferromagnetic microparticles 182.

Referring more particularly to FIG. 9A, microparticles 182, 188 will initially have magnetic domains which are randomly oriented within the uncured photopolymer 184. A suitable magnetic field H is applied across the medium so that microparticles 182 will rotate within uncured photopolymer 184 and align their individual magnetic moments with magnetic field H. Following this alignment, heat and or light are applied to partially cure photopolymer 184 to a solid so that the magnetic domains of microparticles 182 retain their orientation. Superparamagnetic microparticles 188 align themselves according to the alignment of adjacent ferromagnetic microparticles 182 as noted above. A format hologram may then be recorded in the photopolymer 184 in the manner described above.

In FIG. 9B, a data writing beam 190 is focussed on a data storage location 192 to locally heat data storage location 192. Microparticles 182 within data storage location 192 are heated to a temperature which exceeds their Curie point. An external magnetic field H, which is of opposite orientation to the magnetic field shown in FIG. 9A, is applied across medium 186, and heated microparticles 182 within data storage location 192 re-orient themselves with the new magnetic field H. Data writing beam 190 is first removed to allow microparticles 182 within data storage location 192 to cool, and then magnetic field H is removed. As noted above, superparamagentic microparticles undergo orientation according to adjacent ferromagnetic microparticles 182. Microparticles 182, 188 within data storage location 192 thus have magnetic moments which are oppositely oriented with respect to the magnetic moments of microparticles 182, 188 outside of data storage location 192, and can detected by different polarization via the Faraday effect in the manner described above.

Referring to FIG. 9C, the microparticles 182 in data storage location 192 which were aligned as shown in FIG. 9B can be "erased" by exposure to erasing beam 194, which again heats up microparticles 182 at data storage location 192 to a temperature exceeding their Curie point. A magnetic field H, having a direction opposite to that applied during data writing as shown in FIG. 9B, but the same as used during initial orientation as shown in FIG. 9A, is applied while microparticles 182 at data storage location 192 are above their Curie point. Microparticles 182 (and 188) within data storage location 192 align with magnetic field H such that their magnetic domains have the same orientation as microparticles 182, 188 in medium 186 generally. The erasing beam 194 is then removed and the data storage location 192 cools to provide an "erased" data storage location. The medium 186 is thus re-writable.

The Curie point of ferromagnetic microparticles can be adjusted to a certain extent by controlling their size. Microparticle size, however, is ideally kept below 20 nanometer diameter to avoid unwanted light scattering. Ideally, the magnetic microparticles will be highly absorbing at the data writing wavelength to facilitate heating at irradiated data storage locations, but will be transparent at the format hologram recording wavelength.

Various other photoactive materials in microparticle form may also be used with the invention to record data under data writing conditions, and will suggest themselves to those skilled in the art upon review of this disclosure. Such other photoactive materials are considered to be within the scope of this disclosure. The wavelength specific data writing conditions described above generally refer to linear absorption mechanisms. However, the data writing conditions of the invention may alternatively involve non-linear absorption mechanisms as well. Further, while the second photoactive material of the invention is described generally as being in microparticle form, it may alternatively be dissolved within the medium such that the optical medium of the invention is homogeneous.

Accordingly, it will be seen that this invention provides an optical storage system and method having separate, independent format hologram writing and data writing mechanisms to allow optimization of data writing separately from format hologram recording. Although the above description and drawings include many specificities, these should not be construed as limiting the scope of the invention, but as merely providing illustrations of the presently preferred embodiments of the invention. Thus, the scope of this invention should be determined by the appended claims and their legal equivalents.

What is claimed is:

1. An optical storage medium having format hologram comprising:
   (a) a first photoactive material responsive to a format hologram recording condition, wherein the format hologram has a refractive index that varies along an axis of the optical storage medium; and
   (b) a second photoactive material, responsive to a data writing condition, said second photoactive material dispersed in said first photoactive material, wherein the second photoactive material comprises vanadium dioxide microparticles.

2. The optical data storage medium of claim 1, wherein said first photoactive material comprises a photopolymer material polymerizable under said format hologram recording condition.

3. The optical data storage medium of claim 1, wherein said second photoactive material is responsive to said data writing condition to produce an optically detectable change in said optical storage medium.

4. The optical storage medium of claim 1, wherein said format hologram recording condition is specific to a first wavelength.

5. The optical storage medium of claim 4, wherein said data writing condition is specific to a second wavelength.

6. The optical storage medium of claim 3, wherein said vanadium dioxide microparticles are light absorbing, said light absorbing microparticles configured to generate heat upon absorption of light, said heat operable to form an optically detectable change in said optical storage medium proximate to said microparticles.

7. An optical storage medium having a format hologram, comprising:
   (a) a photopolymer material responsive to a format hologram recording condition to generate a first optically detectable change in said optics storage medium, wherein the format hologram has a refractive index that varies along an axis; and
   (b) microparticles, dispersed in said photopolymer material, which are responsive to a data writing condition to generate a second optically detectable change in said optical storage medium, wherein the second photoactive material comprises vanadium dioxide microparticles.

8. The optical storage medium of claim 7, wherein said format hologram recording condition is specific to a first wavelength.

9. The optical storage medium of claim 8, wherein said data writing condition is specific to a second wavelength.

10. The optical storage medium of claim 7, wherein said vanadium dioxide microparticles are light absorbing, said light absorbing microparticles configured to generate heat upon absorption of light, said heat operable to cause said second optically detectable change.

* * * * *